US008514654B2

(12) United States Patent
Yamada et al.

(10) Patent No.: US 8,514,654 B2
(45) Date of Patent: Aug. 20, 2013

(54) STORAGE APPARATUS, SUBSTRATE, LIQUID CONTAINER, SYSTEM, AND CONTROL METHOD OF THE STORAGE APPARATUS

(75) Inventors: Shinichi Yamada, Nagano-ken (JP); Yasuhiko Kosugi, Nagano-ken (JP); Noboru Asauchi, Nagano-ken (JP); Yoshihiro Nakamura, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 281 days.

(21) Appl. No.: 12/875,773

(22) Filed: Sep. 3, 2010

(65) Prior Publication Data
US 2011/0058420 A1 Mar. 10, 2011

(30) Foreign Application Priority Data

Sep. 8, 2009 (JP) ................................. 2009-206832

(51) Int. Cl.
| G11C 7/22 | (2006.01) |
| G11C 8/18 | (2006.01) |
| G11C 7/24 | (2006.01) |
| G11C 8/20 | (2006.01) |
| G11C 5/14 | (2006.01) |
| G06F 1/12 | (2006.01) |
| G06F 1/04 | (2006.01) |
| G06F 11/30 | (2006.01) |
| G06F 5/06 | (2006.01) |

(52) U.S. Cl.
USPC ... 365/233.1; 365/145; 365/226; 365/233.12; 365/233.15; 713/322; 713/340; 713/600; 713/601

(58) Field of Classification Search
USPC ............ 365/145, 226, 233.1, 233.12, 233.15, 365/185.01; 713/322, 340, 600, 601
See application file for complete search history.

(56) References Cited

U.S. PATENT DOCUMENTS

| 4,979,171 | A | * | 12/1990 | Ashley ............................ 370/525 |
| 5,604,917 | A | | 2/1997 | Saito et al. |
| 5,831,805 | A | * | 11/1998 | Sekine et al. .................... 361/86 |
| 6,084,813 | A | * | 7/2000 | Kikuchi et al. ................ 365/222 |
| 6,226,556 | B1 | * | 5/2001 | Itkin et al. ........................ 700/21 |
| 6,798,707 | B2 | | 9/2004 | Niwa et al. |
| 2002/0180851 | A1 | * | 12/2002 | Saruta ............................. 347/86 |
| 2007/0075355 | A1 | * | 4/2007 | Hamada et al. ................ 257/315 |
| 2009/0115474 | A1 | * | 5/2009 | Lee ................................. 327/158 |

FOREIGN PATENT DOCUMENTS

| JP | 58-131500 | 9/1983 |
| JP | 04-137085 | 5/1992 |
| JP | 2002-259357 | 9/2002 |
| JP | 2003-085123 | 3/2003 |
| JP | 2004-299405 | 10/2004 |

* cited by examiner

Primary Examiner — J. H. Hur

(57) ABSTRACT

A storage apparatus including a nonvolatile storage section and a control section controlling the nonvolatile storage section, wherein the control section has a detection circuit detecting floating state in at least one of power supply terminal connected to host side power supply terminal to which a power supply voltage is supplied from the host device, and ground terminal connected to host side ground terminal to which a ground voltage is supplied from the host device and a mask process section performing a mask process of the system clock that is used to control the nonvolatile storage section, wherein the mask process section masks the system clock if the floating state is detected by the detection circuit.

15 Claims, 19 Drawing Sheets

FIG. 21A
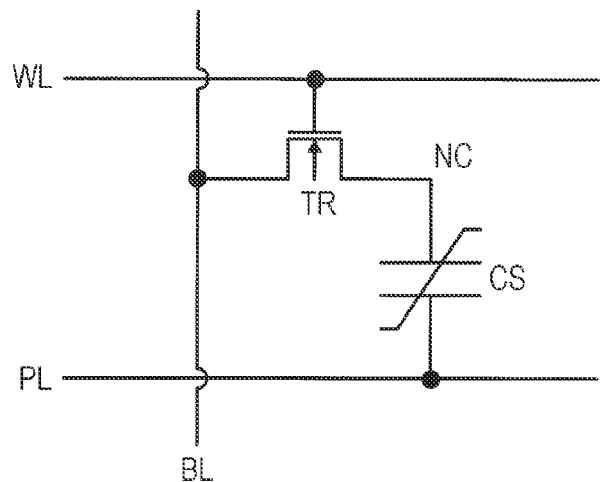
FIG. 21B
|    | "1" | "0" |
|----|-----|-----|
| BL | VCC | 0V  |
| PL | 0V  | VCC |
FIG. 21C
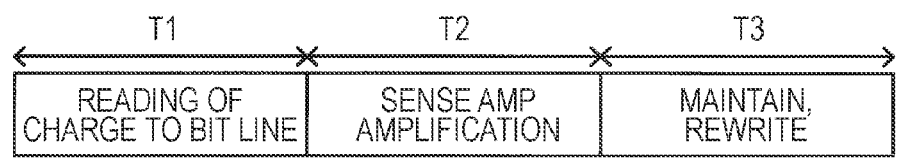

STORAGE APPARATUS, SUBSTRATE, LIQUID CONTAINER, SYSTEM, AND CONTROL METHOD OF THE STORAGE APPARATUS

CROSS-REFERENCE TO RELATED APPLICATION(S)

Japanese Patent Application No. 2009-206832 is hereby incorporated by reference in its entirety.

BACKGROUND

1. Field of Invention

The present invention relates to a storage apparatus, substrate, liquid container, system, and control method of the storage apparatus.

2. Description of Related Art

A representative example of nonvolatile memory (nonvolatile storage section, in a broad sense) is EEPROM or FERAM. Those memories receive or transmit data with respect to the host device, and read or write data. For example, ink jet type printer (the host device) has an ink cartridge (a liquid container). The ink cartridge is provided with the storage apparatus having nonvolatile memory (for example, see JP-A-2004-299405). The nonvolatile memory stores various information such as ID, manufacturing information, and residual amount of ink, and the storage apparatus receives or transmits this information with respect to the printer.

However, read and write of the data are not performed normally, if the power supply of the storage apparatus is failure, such that a corruption may occur in the data stored on the nonvolatile memory. For example, the storage apparatus of the ink cartridge and the printer is generally connected through the contact of terminal, and power is supplied from the printer to the storage apparatus through the terminal. In this case, a corruption of the data stored in the nonvolatile memory may occur if the power supply terminal enters a floating state (non contact state) when it access to the nonvolatile memory. For example, a rewrite is not performed normally when it reads ID or manufacturing information, in a case where the memory needs the rewriting operation when the nonvolatile memory reads an FERAM, and the like.

SUMMARY OF INVENTION

An advantage of some aspects of the invention is that it provides a storage apparatus, substrate, liquid container, system, and control method of the storage apparatus to suppress the occurrence of a corruption of data stored in the nonvolatile storage section.

According to an aspect of the invention, there is provided a storage apparatus including a nonvolatile storage section, and a control section that controls the nonvolatile storage section, wherein the control section comprising: a detection circuit that detects a floating state in at least one of a power supply terminal connected to a host side power supply terminal to which a power supply voltage is supplied from a host device, and a ground terminal connected to the host side ground terminal to which ground voltage is supplied from the host device; and a mask process section that performs a mask process of a system clock which is used to control the nonvolatile storage section, wherein the mask process section masks the system clock when the floating state is detected by the detection circuit.

According to the aspect of the present invention, it is possible to detect a floating state in at least one of power supply terminal connected to the host side power supply terminal to which a power supply voltage is supplied from the host device, and the ground terminal connected to the host side ground terminal to which ground voltage is supplied from the host device. Thus, it is possible to mask the system clock that is used to control the nonvolatile storage section when the floating state is detected. Accordingly, it is possible to suppress the occurrence of a corruption of the data stored in the nonvolatile storage section.

In the storage apparatus, the detection circuit may output a detection signal indicating whether the floating state is detected or not, and the mask process section may have a holding section which maintains a logic level of the detection signal.

According to the aspect of the present invention, it is possible to maintain a non-supply state of the system clock, after the floating state is initially detected, by maintaining the logic level of the detection signal.

Also, in the storage apparatus, the holding section may clear the holding state of the logic level of the detection signal when a reset signal which resets the control section becomes active.

According to the aspect of the invention, it is possible to clear the mask of the system clock, by clearing the holding state of the logic level of the detection signal by reset signal.

In the storage apparatus, the control section may have an access control section that performs access control of reading or writing to the nonvolatile storage section, and the mask process section may mask the system clock which is supplied to the access control section when the floating state is detected by the detection circuit.

According to the aspect of the invention, it is possible to stop the access control of reading or writing to the nonvolatile storage section, by masking the system clock that is supplied to the access control section.

In the storage apparatus, the control section may have a transmission section that performs data transmission to the host device, the mask process section may not mask the system clock which is supplied to the transmission section and the recess control section such that the access control section reads data from the nonvolatile storage section and the transmission section transmits the data to the host device, when the floating state is not detected by the detection circuit, and the mask process section masks the system clock, such that the data is not transmitted to the host device, and the detection of the floating state may be detected as a communication error by the host device, when the floating state is detected by the detection circuit.

According to the aspect of the present invention, it is possible to stop the transmission of the read data to the host device, by masking the system clock that is supplied to the access control section and the transmission section. Thus, the host device may detect the detection of the floating state as a communication error by the detection circuit.

In the storage apparatus, the control section has a data determination section determining if data received from the host device is normal or not, and the mask process section may mask the system clock which is supplied to the data determination section, when the floating state is detected by the detection circuit.

In the storage apparatus, the control section may have a transmission section that performs data transmission to the host device, the mask process section does not mask the system clock such that the data determination section determines whether the data received from the host device is normal or not, and the transmission section transmits information on the determination results to the host device by the data determination section, when the floating state is not detected by the detection circuit, and the mask process section may mask the system lock such that the information on the determination result is not transmitted to the host device, and the detection of the floating state is detected as a communication error by the host device, when the floating state is detected by the detection circuit.

According to the aspect of the present invention, it is possible to stop the transmission of the information on the determination results to the host device, by masking the system clock that is supplied to the data determination section and the transmission section. Thus, the host device may detect the detection of the floating state as a communication error by the detection circuit.

In the storage apparatus, the nonvolatile storage section is a nonvolatile memory that is necessary for rewriting of the read data in the reading operation.

According to the aspect of the invention, it is possible to stop a reading operation, such that occurrence of a corruption of data by incomplete rewriting can be suppressed.

According to another aspect of the invention, there is provided a substrate comprising the storage apparatus according to any one of the above description.

According to further another aspect of the invention, there is provided a liquid container comprising the storage apparatus according to any one of the above description.

According to still further another aspect of the invention, there is provided a system comprising a storage apparatus according to any one of above description; and a host device.

According to yet still further another aspect of the invention, there is provided a method of controlling a storage apparatus comprising: controlling a nonvolatile storage section; performing a mask process of system clock which is used to control the nonvolatile storage section; detecting a floating state in at least one of a power supply terminal connected to a host side power supply terminal to which a power supply voltage is supplied from a host device, and a ground terminal connected to the host side ground terminal to which ground voltage is supplied from the host device; and masking a system clock that is used to control the nonvolatile storage section when the floating state is detected.

BRIEF DESCRIPTION OF THE DRAWINGS

The invention will be described with reference to the accompanying drawings, wherein like numbers reference like elements.

FIG. 21A is an explanatory view showing the detailed constitutions of the ferroelectric memory cell, FIG. 21B is an explanatory view explaining the write operation to the ferroelectric memory cell, and FIG. 21C is an explanatory view explaining the read operation to the ferroelectric memory cell.

DESCRIPTION OF THE PREFERRED EMBODIMENTS

Hereinafter, an embodiment of the invention will be described in detail. In addition, the embodiments shown in below do not limit the contents of the invention described in the appended claims and all configurations shown in the following embodiments are not necessarily indispensable as a solving means of the invention described in the appended claims.

1. Constitution Example

Figure 1:
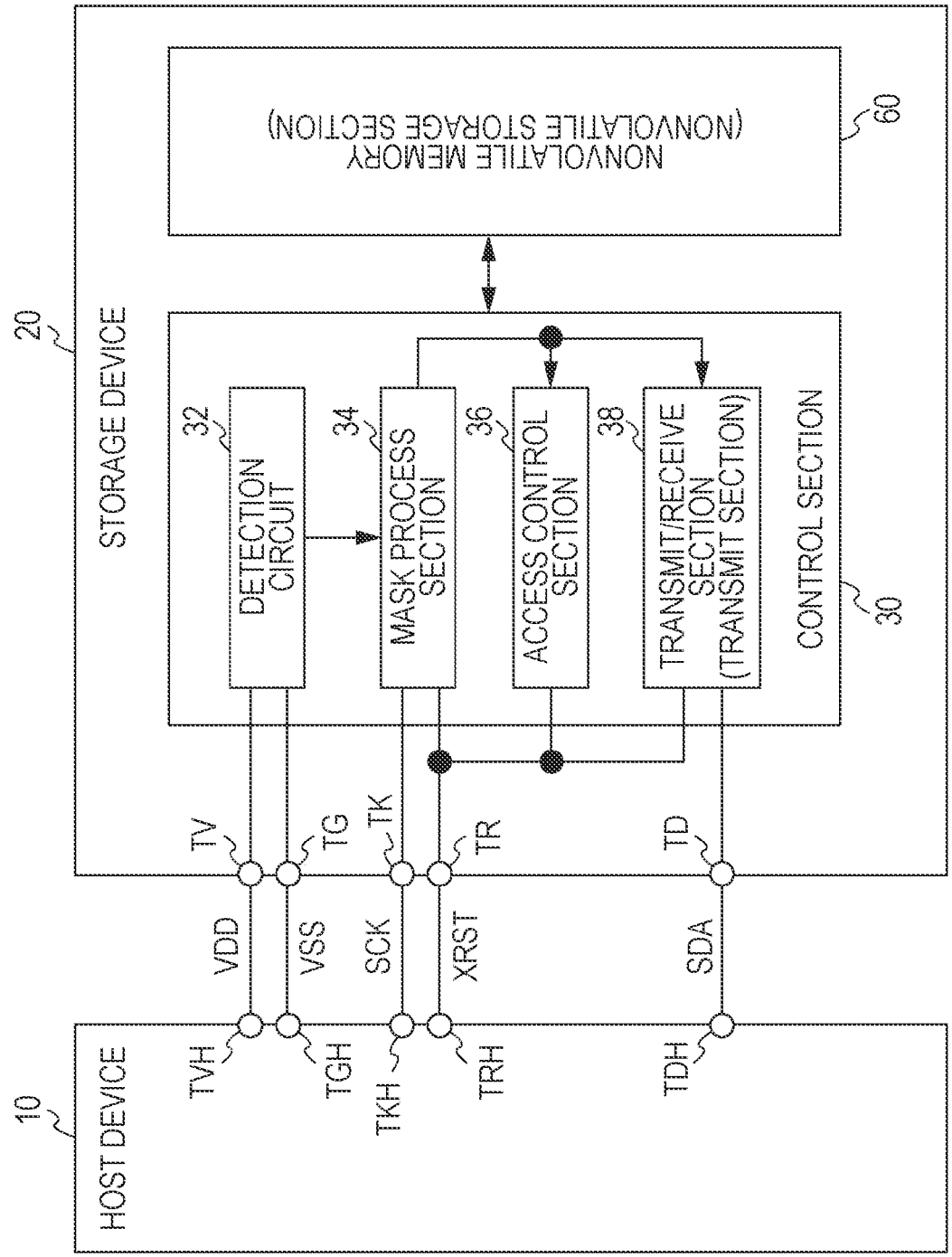
FIG. 1 is a constituent diagram showing the constitutions of the storage apparatus of an embodiment of the present invention.

FIG. 1 is a block diagram showing the constitutions of the storage apparatus of an embodiment of the present invention. The storage apparatus 20 as shown in FIG. 1 includes a control section 30 (memory control section, control circuit), a nonvolatile memory 60 (nonvolatile storage section), a power supply terminal TV (first power supply terminal, a high voltage power supply terminal), a ground terminal TG (second power supply terminal, low voltage side power supply terminal, ground terminal), a clock terminal TK (first terminal), a data terminal TD (second terminal), a reset terminal TR. Also, the present invention is not limited to the embodiment of FIG. 1, but the present invention may omit some of the constituent elements (for example, clock terminal, data terminal), or may add other constituent elements, thus it may be various further embodiments.

The storage apparatus 20 masks the system clock, so that it can suppress a data corruption of the nonvolatile memory 60 by power supply failure, when the power supply failure is detected. Hereinafter, an embodiment will be described in a case where the nonvolatile storage section is a nonvolatile memory 60. However, in this embodiment, the nonvolatile storage section may be different members, for example an electromagnetic drive such as hard disk drive and the like, or an optical drive such as DVD and the like.

Power supply terminal TV, ground terminal TG, clock terminal TK, data terminal TD, and reset terminal TR are connected electrically to host side power supply terminal TVH of the host device 10, host side ground terminal TGH, host side clock terminal TKH, host side data terminal TDH, and host side reset terminal TRH respectively. For example, each terminal of the host device 10 and the storage apparatus 20 constitutes a metal terminal, and the terminal is physically connected for an electrical connection. When terminal of the host device 10 and the terminal of the storage apparatus 20 are connected together, the power supply voltage VDD (first power supply voltage, high voltage side power supply voltage) is supplied to the power supply terminal TV from the host side power supply terminal TVH. Also, ground voltage VSS (second power supply voltage, low voltage side power supply voltage) is supplied to the ground terminal TG from the host side ground terminal TGH. The system clock SCK (first signal) is supplied to the clock terminal TK from host side clock terminal TKH, and data signal (second signal) is supplied to the data terminal TD from host side data terminal TDH. Reset signal XRST is supplied to the reset terminal TR from host side reset terminal TRH.

The control section 30 controls the nonvolatile memory 60 (nonvolatile storage section, in a broad sense), receives and/or transmits the data (data communication) from/to the host device 10 (host), and detects the power supply failure. More specifically, the control section 30 includes a detection circuit 32 (detection section), a mask process section 34 (mask process circuit), an access control section 36 (access control circuit), and a transmitting/receiving section 38 (communication section, transmitting/receiving circuit).

The detection circuit 32 detects a failure of the power supplied to the storage apparatus 20, and outputs the detection signal (information on the detection result) to the mask process section 34. More specifically, the detection circuit 32 detects a floating state (open state, non contact state) of the power supply terminal TV, a floating state of the ground terminal TG, and a voltage drop in the power supply voltage VDD. For example, the floating state of the power supply terminal TV or ground terminal TG occurs due to the foreign materials inserted or poor connection of the terminals and the like. The detection circuit 32 detects those floating states on the basis of voltage from the power supply terminal TV or ground terminal TG.

The mask process section 34 performs the mask processing of the system clock SCK on the basis of the detection signal from the detection circuit 32. In this regard, the system clock SCK is a clock for use to control the storage apparatus 20. For example, SCK generates a clock for access control of read/write (reading or writing) of the nonvolatile memory, or is a clock to perform data transmitting/receiving between the host device 10 and the storage apparatus 20. The system clock SCK may be supplied from the terminal TK, or generated within the storage apparatus 20 as shown in FIG. 1.

When the power supply failure is detected by the detection circuit 32, the mask process section 34 masks the system clock SCK from the clock terminal TK. In other words, the system clock SCK is not supplied to the constituent elements of the control section 30, such as the access control section 36 or the transmitting/receiving section 38. For example, the system clock is set in low level (first logic level) or high level (second logic level) after mask processing so that SCK is not supplied. In this case, operation of the storage apparatus 20 is stopped. That is to say, read/write operation to the nonvolatile memory 60, or data transmitting/receiving from/to the host device 10 is not performed. Meanwhile, if the detection circuit 32 does not detect power supply failure, the mask process section 34 may not mask the system clock SCK, and SCK is supplied to the constituent elements of the control section 30. In this case, the storage apparatus 20 is normally operated.

The access control section 36 performs access control (memory access control) to the nonvolatile memory 60, on the basis of the system clock after mask processing from the mask process section 34. In other words, the read operation (read operation) of the data stored at each address of the nonvolatile memory 60 or write operation (write operation) of the data to each address of the nonvolatile memory 60 are performed, synchronized with the system clock. More specifically, the address control section 36 generates a write enable signal, a read address signal, a write address signal, a write data signal and the like, to perform the access control. Also, the access control section 36 may perform sequential access to the nonvolatile memory 60 and the random access may be performed.

The transmitting/receiving section 38 (receiving section or transmission section) performs the data transmitting/receiving between the host device 10 and the storage apparatus 20, on the basis of the system clock after mask processing from the mask process section 34. Also, the transmitting/receiving section 38 outputs the received data to the access control section 36, and the access control section 36 writes the data to the nonvolatile memory 60. Furthermore, the transmitting/receiving section 38 transmits the read data to the host device 10 from the nonvolatile memory 60 by the access control section 36. More specifically, the transmitting/receiving device 38 receives the data signal SDA from the host device 10 through the data terminal TD. For example, the receiving data signal SDA includes the commands such as a read command or a write command, an address signal, and a data signal. Also, by the access control section 36, the transmitting/receiving section 38 transmits the read data from the nonvolatile memory 60 to the host device 10 through the data terminal TD.

The nonvolatile memory 60 includes EEPROM such as FERAM (ferroelectric memory) or flash memory and the like, for example. The nonvolatile memory 60 may include a memory array, a column selection circuit, and row selection circuit. The nonvolatile memory 60 stores ID recorded at the time of manufacturing, manufacturing information, or write information from the host device 10. For example, in case of ink cartridge, the nonvolatile memory 60 stores as the manufacturing information, the information on the manufacturing date, information on ink color and the like, and further stores the information on the residual amount of ink as write information from the host device 10.

However, in the storage apparatus having the nonvolatile memory, when read/write of the data does not performed normally caused by failure of power supply, it has a problem that data which is stored nonvolatile memory may be corrupted.

Regarding this point, according to the embodiment, the detection circuit 32 detects the floating state in at least one of the power supply terminal TV connected to the host side power supply terminal TVH to which the power supply voltage VDD is supplied from the host device 10, and the ground terminal TG connected the host side ground terminal TGH to which ground voltage VSS is supplied from the host device 10. Then, the mask process section 34 masks the system clock SCK used for control of the nonvolatile memory 60, when the detection circuit 32 detects the floating state.

Accordingly, it can suppress the corruption of the data stored in the nonvolatile memory 60. In other words, when a floating state of the power supply terminal TV or the ground terminal TG is detected, the system block SCK used for control of the nonvolatile memory 60 is masked, so that the control of the nonvolatile memory 60 is not performed. On this account, a read operation or a write operation to the nonvolatile memory 60 is not performed, thus it can suppress the corruption of the data stored in the nonvolatile memory 60.

More specifically, in this embodiment, the mask process section 34 masks the system clock SCK supplied to the access control section 36, when a floating state is detected by the detection circuit 32.

Accordingly, a read/write operation to the nonvolatile memory 60 may be stopped by masking the system clock SCK supplied to the access control section 36.

Also, in this embodiment, the access control section 36 reads data from the nonvolatile memory 60, and the transmitting/receiving section 38 transmits the data to the host device 10, when floating state is not detected by the detection circuit 32. Thus, the mask process section 34 masks the system clock SCK supplied to the access control section 36 and the transmitting/receiving section 38, when a floating state is detected by the detection circuit 32.

Accordingly, transmission of the read data (read data) to the host device 10 is stopped by masking the system connect SCK supplied to the access control section 36 and the transmitting/receiving section 38. Thus, the host device 10 may detects a floating state as a communication error by the detection circuit 32.

Also, the control section 30 may have the data determination section 54 determining whether or not the data received from the host device 10 is normal, as will be described below referred to in FIG. 10. Thus, the mask process section 34 may mask the system clock SCK supplied to the data determination section 54 when a floating state is detected by the detection circuit 32.

Accordingly, the system clock SCK supplied to the data determination section 54 is masked, so that the process can be stopped to determine whether or not the data received from the host device 10 is normal.

Also, in this embodiment, the data determination section 54 determines whether the data received from the host device 10 is normal or not, and the transmitting/receiving section 38 may transmit the information on the determination result to the host device 10 by the data determination section 54, when floating state is not detected by the detection circuit 32. Thus, the mask process section 34 may mask the system clock SCK supplied to the data determination section 54 and transmitting/receiving section 38, when the detection circuit 54 detects a floating state.

Accordingly, the system clock SCK supplied to the data determination section 54 and the transmitting/receiving section 38 is masked, so that transmission of the information on the determination result to the host device 10 is stopped. Thus, the host device 10 may detect a floating state as a communication error by the detection circuit 32.

Also, the detection circuit 32 outputs detection signal FLTO indicating that whether floating state is detected or not, and the holding section 100 maintains the logic level of the detection signal FLTO(QDT), as will be described in below referred to in FIG. 2.

Accordingly, after floating state is detected initially, the logic level of the detection signal FLTO is maintained, so that a non-supply state of the system clock SCK may be maintained. Also, in this embodiment, the holding section 100 may include a flip-flop circuit FF. Thus, hazard of the system clock MSCK will be prevented, and a malfunction of the circuit will be prevented after the mask process.

Also, the holding section 100 may clear the holding state of logic level of the detection signal FLTO, when reset signal XRST that resets the control section 30 becomes active as will be described in below referred to in FIG. 2.

Accordingly, the holding state of logic level of the detection signal FLTO by reset signal XRST is cleared, so that mask of the system clock SCK may be cleared.

Also, in this embodiment, the nonvolatile memory 60 may be the nonvolatile memory which is necessary to rewrite (rewrite) the read data in the read operation. For example, the nonvolatile memory may be a ferroelectric memory as will be described in below referred to in FIG. 21A.

Accordingly, when the floating state is detected by the detection circuit 32 the read operation stops, so that data corruption by rewriting can be suppressed. Namely, it can suppress that the power supply terminal TV or the ground terminal TG becomes floating state, rewrite becomes uncompleted and read data is rewritten incorrectly.

2. Detection Circuit and Mask Process Section

Figure 2:
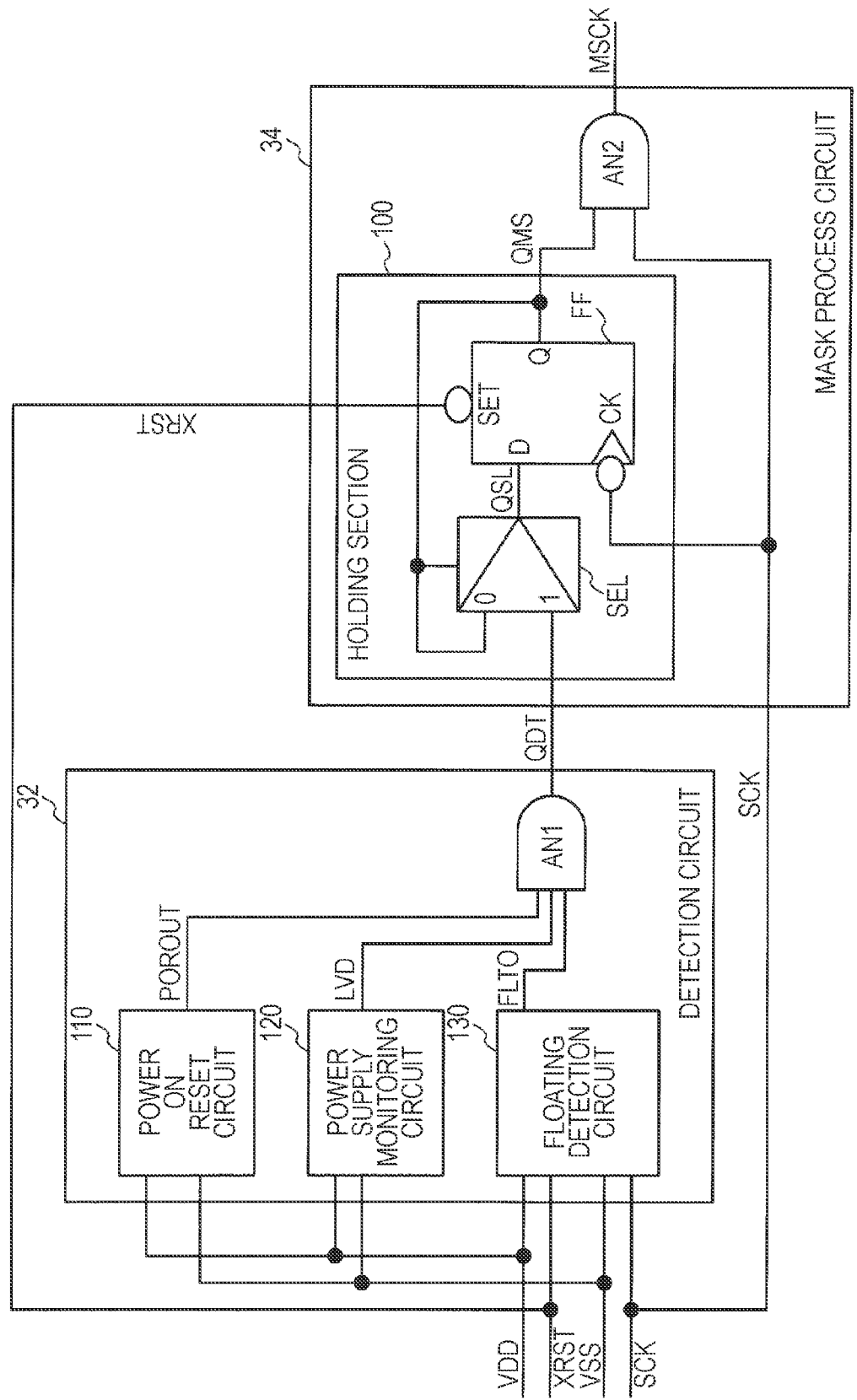
FIG. 2 is a constituent diagram showing the detailed constitutions of the detection circuit and the mask process circuit.

FIG. 2 is a block diagram showing the detailed constitutions of the detection circuit and the mask process section. The detection circuit 32 shown in FIG. 2 includes a power-on reset circuit 110, a power supply monitoring circuit 120 (power supply voltage drop detection circuit), a floating detection circuit 130, and an AND circuit AN1 (logic integrated circuit). Also, the mask process section 34 shown in FIG. 2 includes a holding circuit 100 (holding section), an AND circuit AN2 (logic integrated circuit). Also, the detection circuit and the mask process circuit in this embodiment are not limited to the above described constitutions, some of the constituent elements may be omitted (for example, the power-on reset circuit, and the power supply monitoring circuit), or other constituent elements may be added, so various modifications can be made.

The power-on reset circuit 110 performs power-on reset on the basis of the power supply voltage VDD. More specifically, the storage apparatus 20 is in the reset state until power is supplied and the storage apparatus 20 clears reset when power is supplied. The power-on reset circuit 110 is supplied with power by the host device 10, and when the difference between the power supply voltage VDD and ground voltage VSS is not less than a threshold voltage (predetermined voltage), an output signal POROUT is set to the high level (first logic level, in a broad sense).

The power supply monitoring circuit 120 detects a voltage drop in the power supply voltage VDD. More specifically, the power supply monitoring circuit 120 outputs the output signal LVD at high level, when the difference between the power supply voltage VDD and ground voltage VSS is not less than threshold voltage. Meanwhile, an output signal LVD of low level (second logic level, in a broad sense) is outputted, when the difference between the power supply voltage VDD and ground voltage VSS is not more than the threshold voltage.

The floating detection circuit 130 detects the floating state of the power supply terminal TV and the ground terminal TG. For example, the floating detection circuit 130 detects a floating state by comparing voltage between the power supply voltage VDD or ground voltage VSS and reference signal voltage as will be described hereinafter referred to in FIG. 17. Thus, the output signal FLTO of high level is outputted when a floating state is not detected, and the output signal FLTO of low level is outputted when a floating state is detected.

AND circuit AN1 computes logic integration of output signal POROUT from the power-on reset circuit 110, the output signal LVD from the power supply monitoring circuit 120 and the output signal FLTO from the floating detection circuit 130. In other words, the output signal QDT of low level (active) is outputted, when at least one of POROUT, LVD, and FLTO is low level (active).

The holding section 100 (mask signal generation circuit, in a broad sense) outputs the mask signal QMS for mask processing the system clock SCK, on the basis of the detection signal QDT from the detection circuit 130. More specifically, the mask signal QMS is not active until a floating state is detected, and the mask signal QMS is active when a floating state is detected. Thus, after the mask signal QMS is active once, QMS is maintained active. More specifically, the holding section 100 maintains the detection signal QDT. In other words, if the detection signal QDT is changed to low level, then it maintains its low level even after that. The holding section 100 includes selector SEL (selection circuit) and flip-flop circuit FF.

The selector SEL selects one of the detection signal QDT and the mask signal QMS on the basis of the mask signal QMS, and selected signal is outputted as the output signal QSL. More specifically, the detection signal QDT is selected and outputted, when the mask signal QMS is high level, and the mask signal QMS is selected and outputted, when the mask signal QMS is low level.

The flip-flop circuit FF latches (maintains) the logic level of the output signal QSL from the selector SEL at the down edge (or rising edge) the system clock SCK, and the mask signal QMS of latched logic level is outputted. Also, when the reset signal XRST (or, set signal) is active, the latched logic level is reset (or, set). More specifically, the mask signal QMS is reset (clear) when a reset signal XRST is low level, and the mask signal QMS of high level is outputted. Meanwhile, reset is cleared when reset signal XRST is low level, and mask signal QMS of latched logic level is outputted.

Just after the reset is cleared, the detection signal QDT is selected by the selector SEL to output the mask signal QMS of high level. If the detection signal QDT is low level, then output signal QSL of the selector SEL becomes low level, and flip-flop circuit FF latches low level. Then, the mask signal QMS of low level is selected by the selector SEL, so that the mask signal QMS is maintained at a low level. The holding state is maintained until it becomes reset with the reset signal XRST.

AND circuit AN2 (mask process circuit, in a broad sense) performs mask of the system clock SCK, on the basis of the mask signal QMS. More specifically, AND circuit AN2 computes logic integration of the mask signal QMS and the system clock SCK. In other words, the system clock MSCK is low level and the system clock SCK is not supplied to the following circuit, after the mask process, when the mask signal QMS is low level. Meanwhile, in a case that the mask signal QMS becomes high level, the system clock SCK is outputted as the system clock MSCK, and the system clock SCK is supplied to following circuit after mask process.

3. Operation Embodiment

The operation embodiment is described hereinafter using FIG. 3 to FIG. 7. During normal operation, that is to say, FIG. 3 shows the operation embodiment when the power supply failure such as floating of the power supply terminal does not occurred.

Figure 3:
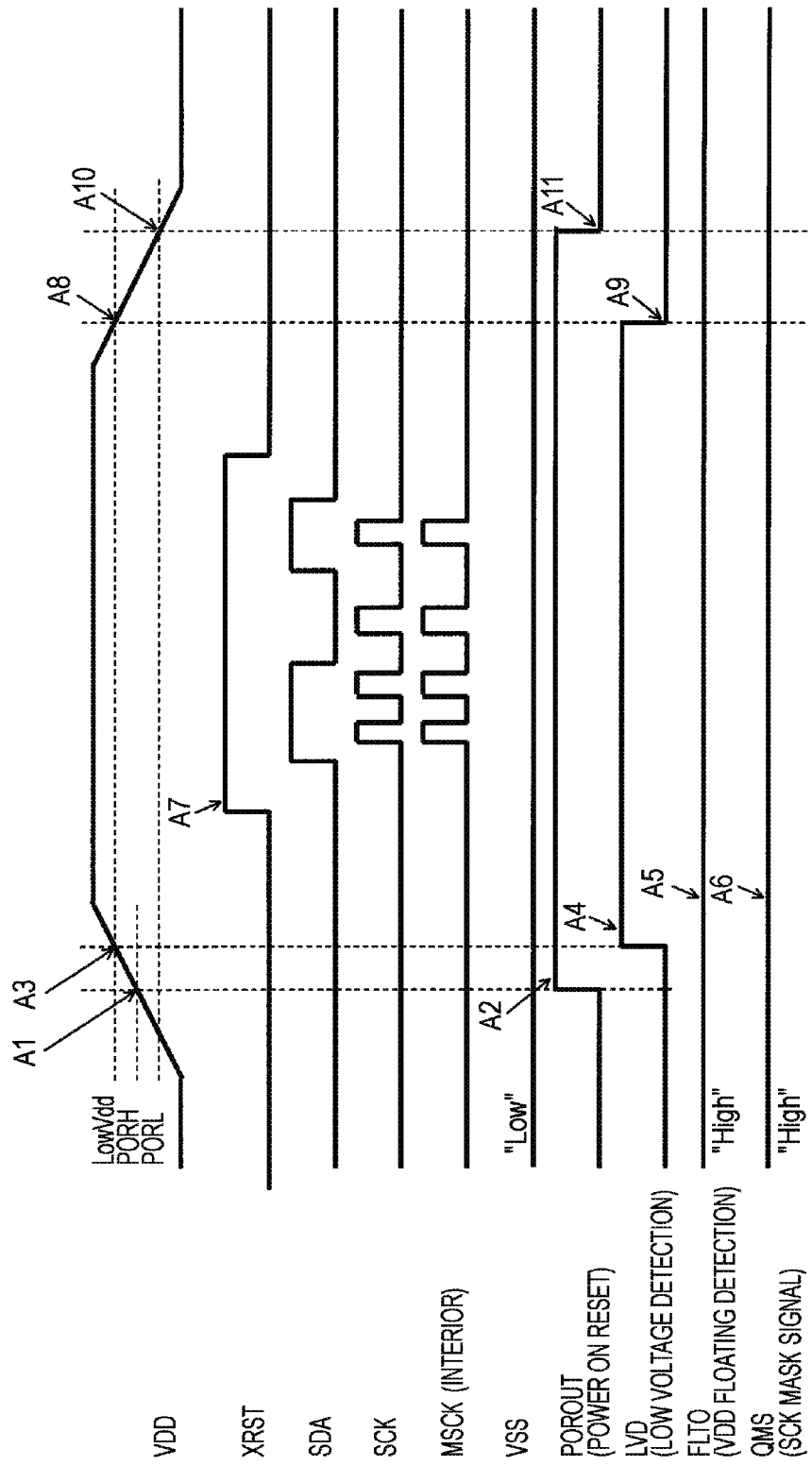
FIG. 3 is an explanatory view showing the operation of the storage apparatus of the embodiment.

As shown in A1 in FIG. 3, when the power supply voltage VDD is over a threshold voltage PORH (first threshold voltage), the signal POROUT becomes high level, and the power-on reset is cleared, as shown in A2. When VDD is over a threshold voltage LowVDD as shown in A3, the signal LVD becomes high level, and low voltage detection enters a non-detection state as shown in A4. As shown in A5, signal FLTO outputs a high level, and the floating detection becomes a non-detection state. Thus, as shown in A6, the mask signal QMS outputs a high level, and the system clock SCK is supplied to the control section.

Further, as shown in A7, reset signal XRST is set to high level and the reset is cleared, then the data signal SDA and the system clock SCK is inputted. As shown in A8, if the power supply is off and VDD is not more than the threshold voltage LowVDD, signal LVD becomes low level, as shown in A9. As shown in A10, when VDD is not more than the threshold voltage PORL (second threshold voltage), signal POROUT becomes low level, as shown in A11.

Figure 4:
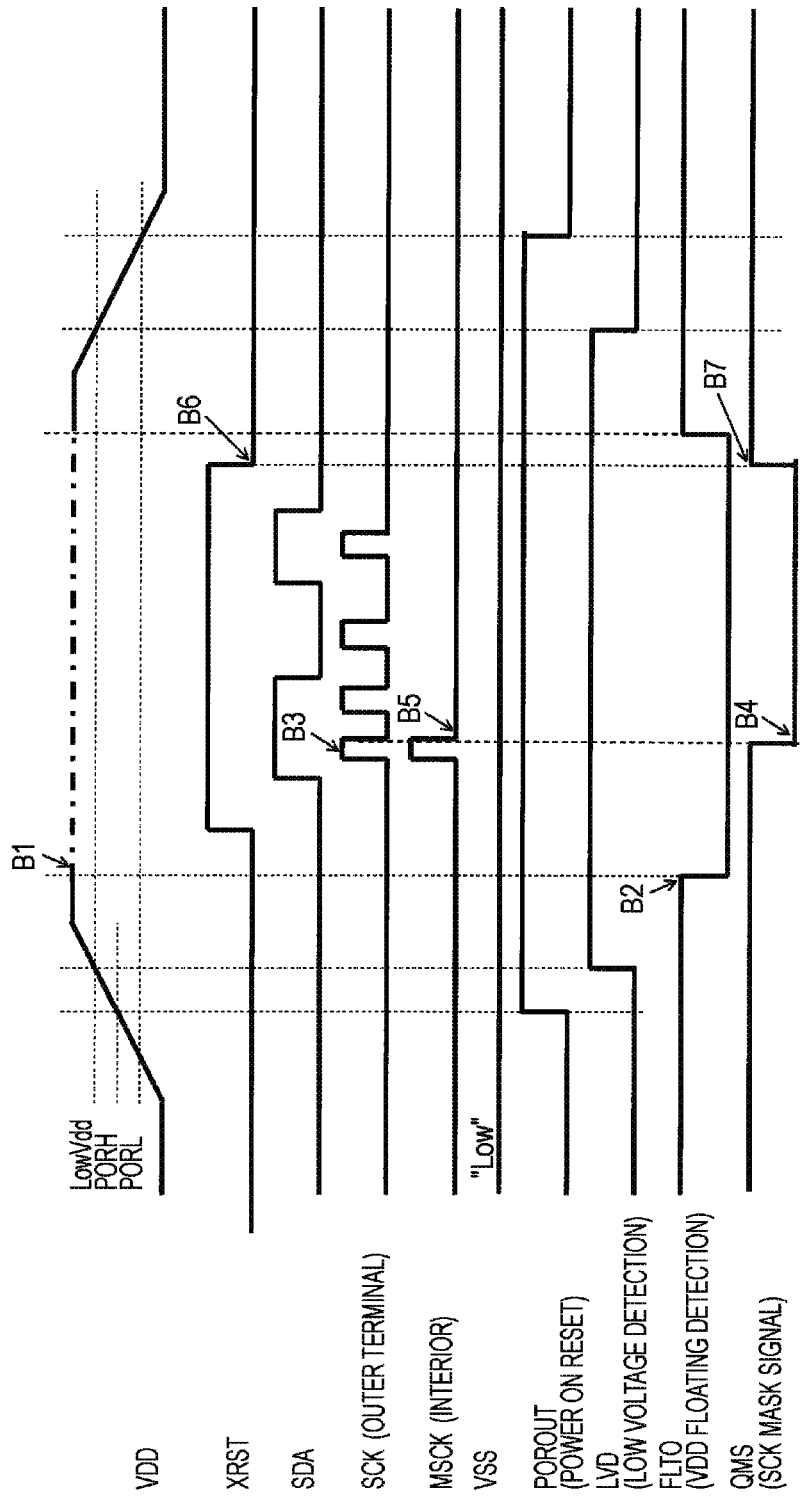
FIG. 4 is an explanatory view showing the operation of the storage apparatus of the embodiment.

FIG. 4 shows an operation embodiment where the power supply terminal TV or the ground terminal TG is a floating state before the system clock SCK is inputted.

As shown in B1 in FIG. 4, when the power supply terminal TV is the floating state, the signal FLTO becomes low level, as shown in B2. As shown in B3, the system clock SCK is inputted, and the mask signal QMS is low level at the initial down in edge of SCK as shown in B4. Thus, as shown in B5, the system clock MSCK outputs SCK until the initial down in edge of SCK after the mask process, then a low level is outputted. As shown in B6, when the reset is cleared, the holding state of the mask signal QMS is cleared, and QMS becomes high level as shown in B7. Regarding other operations, they are the same as outlined in FIG. 3.

As described above, the system clock SCK is supplied, and the normal access control is performed, in the normal operation of FIG. 3. However, the mask signal QMS is maintained at low level (active), in the detection of floating state of FIG. 4. Thus, the system clock SCK is masked, and access control is stopped.

Figure 5:
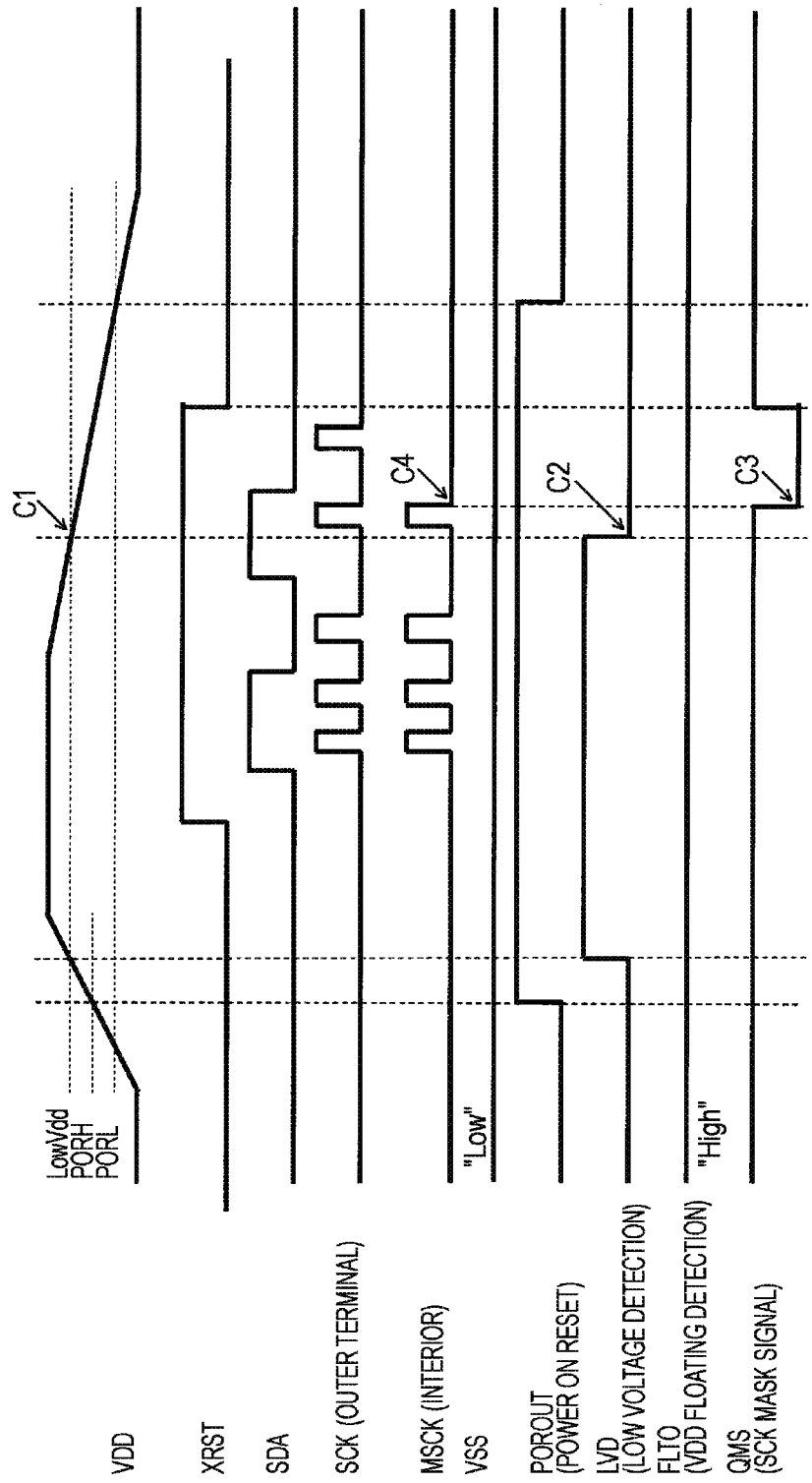
FIG. 5 is an explanatory view showing the operation of the storage apparatus of the embodiment.

FIG. 5 shows an operation embodiment when the power supply voltage VDD drops during normal operation. As shown in C1 in FIG. 5, when the power supply voltage VDD is not more than the threshold voltage LowVDD, signal LVD becomes low level as shown in C2. As shown in C3, after signal LVD becomes low level, the mask signal QMS becomes low level at the initial down edge of the system clock SCK. Thus, as shown in C4, the system clock SCK is masked, the system clock MSCK outputs a low level after the mask process. Regarding other operations, they are the same as outlined in FIG. 3.

Figure 6:
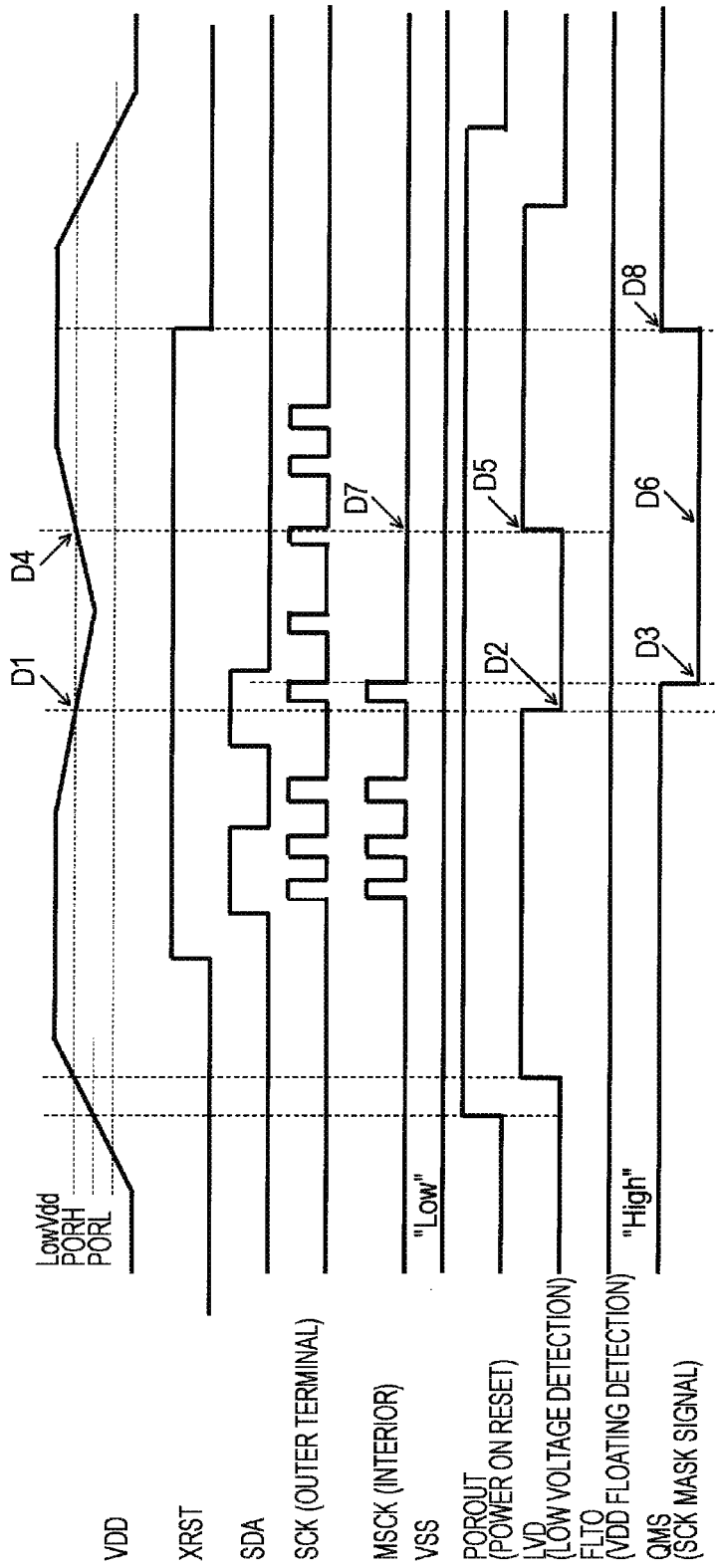
FIG. 6 is an explanatory view showing the operation of the storage apparatus of the embodiment.

FIG. 6 shows an operation embodiment when the power supply voltage VDD drops during normal operation and the power supply voltage VDD is returned again. As shown in D1 in FIG. 6, when the power supply voltage VDD becomes not more than threshold voltage LowVDD, as shown in D2, signal LVD becomes low level, and mask signal QMS is low level, as shown in D3. As shown in D4, when the power supply voltage VDD is not less than threshold voltage LowVDD, signal LVD becomes high level, as shown in D5. In this case, as shown in D6, mask signal QMS is maintained in low level, and the system clock SCK maintains in non-supply state, as shown in D7. As shown in D8, the holding state of the mask signal QMS is reset by reset clearing. Regarding other operations, they are the same outlined in FIG. 5.

Figure 7:
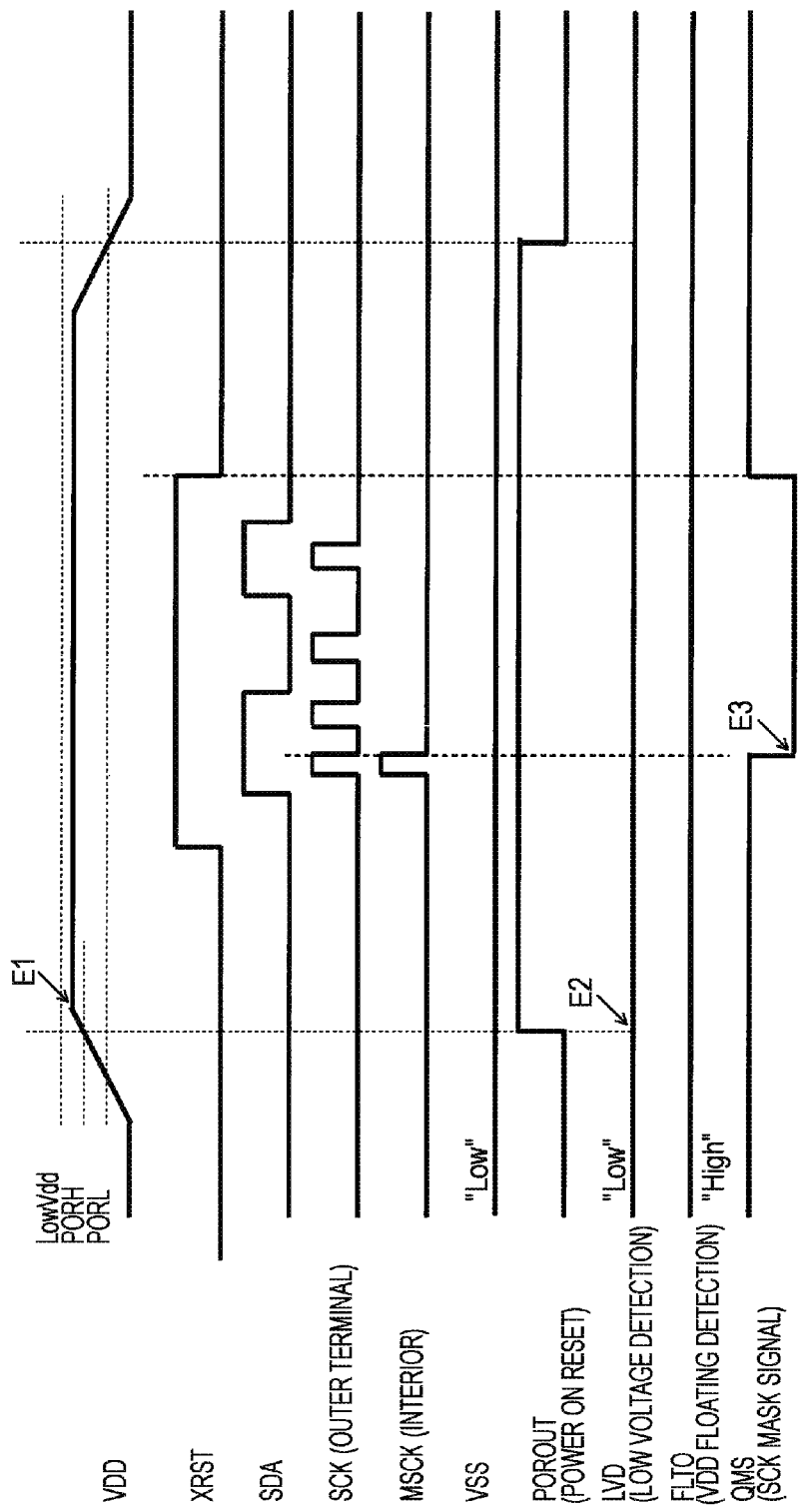
FIG. 7 is a view showing the operation of the storage apparatus of the embodiment.

FIG. 7 shows an operation embodiment when the power supply voltage VDD is not more than the threshold voltage LowVDD before the operation start. As shown in E1 in FIG. 7, because the power supply voltage VDD is not more than the threshold voltage LowVDD, signal LVD outputs a low level, as shown in E2. Thus, as shown in E3, mask signal QMS becomes low level at the initial down in edge of system clock SCK, and system clock SCK is masked. Regarding other operations, they are the same as outlined in FIG. 3.

Also, in the above description of FIG. 4, an embodiment is described when the power supply terminal TV is in a floating state. However, in this embodiment, the operation is the same as FIG. 4 even in the case where the ground terminal TG is the floating state, or the power supply voltage VDD drops. And, in the above description of FIG. 5 to FIG. 7, an embodiment is described in case where the power supply voltage VDD drops. However, in this embodiment, the operation is the same as that of aforementioned embodiments even in the case where the power supply terminal TV or ground terminal TG is the floating state.

4. Liquid Container

Next, detailed description will be made regarding the liquid container in which a storage apparatus of the embodiment described above is mounted, as referred to in FIG. 8. Hereinafter, description will be made when the host device is an ink jet type printer, the liquid container is an ink cartridge, and the substrate is a circuit substrate mounted on the ink cartridge. However, in this embodiment, the host device, the liquid container, and the substrate may be other devices, containers, or substrates. For example, the host device may be a memory reader/writer of memory card, and the substrate may be a circuit substrate mounted on the memory card.

Figure 8:
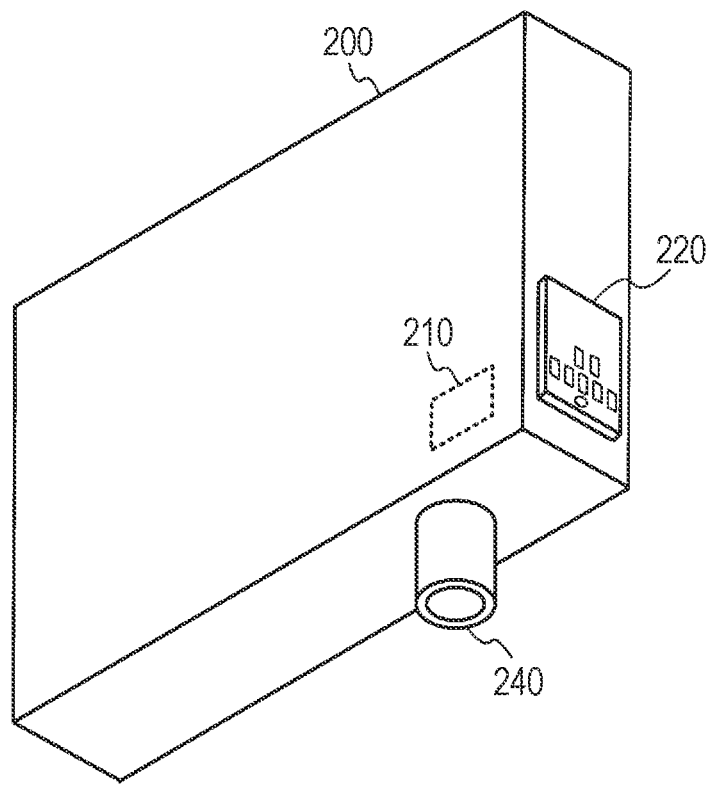
FIG. 8 is an explanatory view showing the detailed constitutions of an ink cartridge of the embodiment.

The interior of the ink cartridge 200 (the liquid container, in a broad sense) as shown in FIG. 8 forms an ink chamber (not shown) to contain ink. Also, an ink supply port 240 that is connected with the ink chamber is mounted in the ink cartridge 200. The ink supply port 240 supplies ink to the print head unit, when the ink cartridge 200 is mounted on the printer.

The ink cartridge 200 includes sensor 210, and circuit substrate 220 (substrate, in a broad sense). The sensor 210 detects a residual amount of ink in the ink chamber. The sensor 210 includes a piezoelectric element for example, and is fixed within the ink cartridge 200. The circuit substrate 220 is provided with the storage apparatus 20 of this embodiment, and stores data, or receives and/or transmits data from/to the host device 10. The circuit substrate 220 is realized by a print substrate for example, and is mounted on the surface of the ink cartridge 200. The circuit substrate 220 is provided the terminal of the power supply terminal TV and the like. Thus, when the ink cartridge 200 is mounted on the printer, those terminals contact (electrical connection) the printer side terminals, and the power supply or data is transmitted or received.

5. Substrate

Figure 9A:
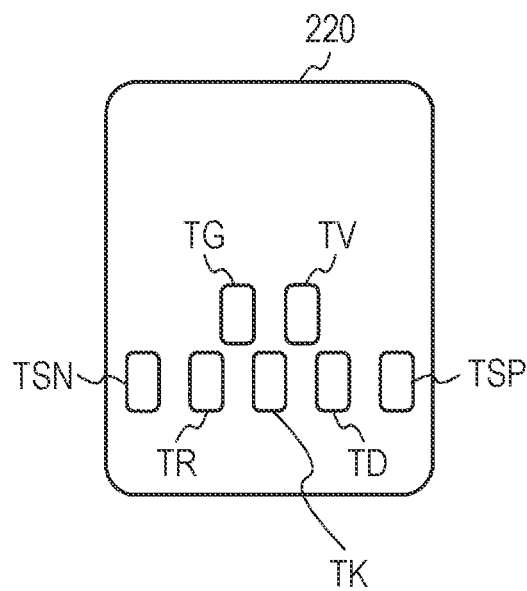
FIG. 9A and FIG. 9B are explanatory views showing the detailed constitutions of a circuit substrate.
Figure 9B:
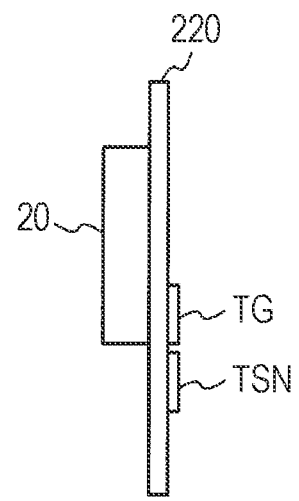

FIG. 9A and FIG. 9B are explanatory views showing the detailed constitutions of a circuit substrate in which the storage apparatus of this embodiment is mounted. As shown in FIG. 9A, the surface of the circuit substrate 220 (surface contacting to the printer) is provided with a terminal group having a plurality of terminals. The terminal group includes a ground terminal TG, a power supply terminal TV, a first sensor driving terminal TSN, a reset terminal TR, a clock terminal TK, a data terminal TD, and a second sensor driving terminal TSP. Each terminal is composed of metal terminal formed in a rectangular shape (substantially rectangular shape), for example. Thus, each terminal is connected to the storage apparatus 20 or the sensor 210 through wire pattern layer or through hole not shown in the drawings that is mounted on the circuit substrate 220.

As shown in FIG. 9B, rear surface of circuit substrate 220 (back surface of connecting surface to the printer) is provided with the storage apparatus 20 of this embodiment. The storage apparatus 20 is composed of the semiconductor storage apparatus having the ferroelectric memory. The storage apparatus 20 stores various data relating ink or the ink cartridge 200, and stores various data relating ink consumption amount or ink color, for example. Data on the ink consumption amount is data that indicates the total amount of ink consumption while the performance of printing regarding ink received in the ink cartridge 200. Data on the ink consumption amount may be information indicating ink amount in the ink cartridge 200, or information regarding ratio of ink consumption.

6. System

Figure 10:
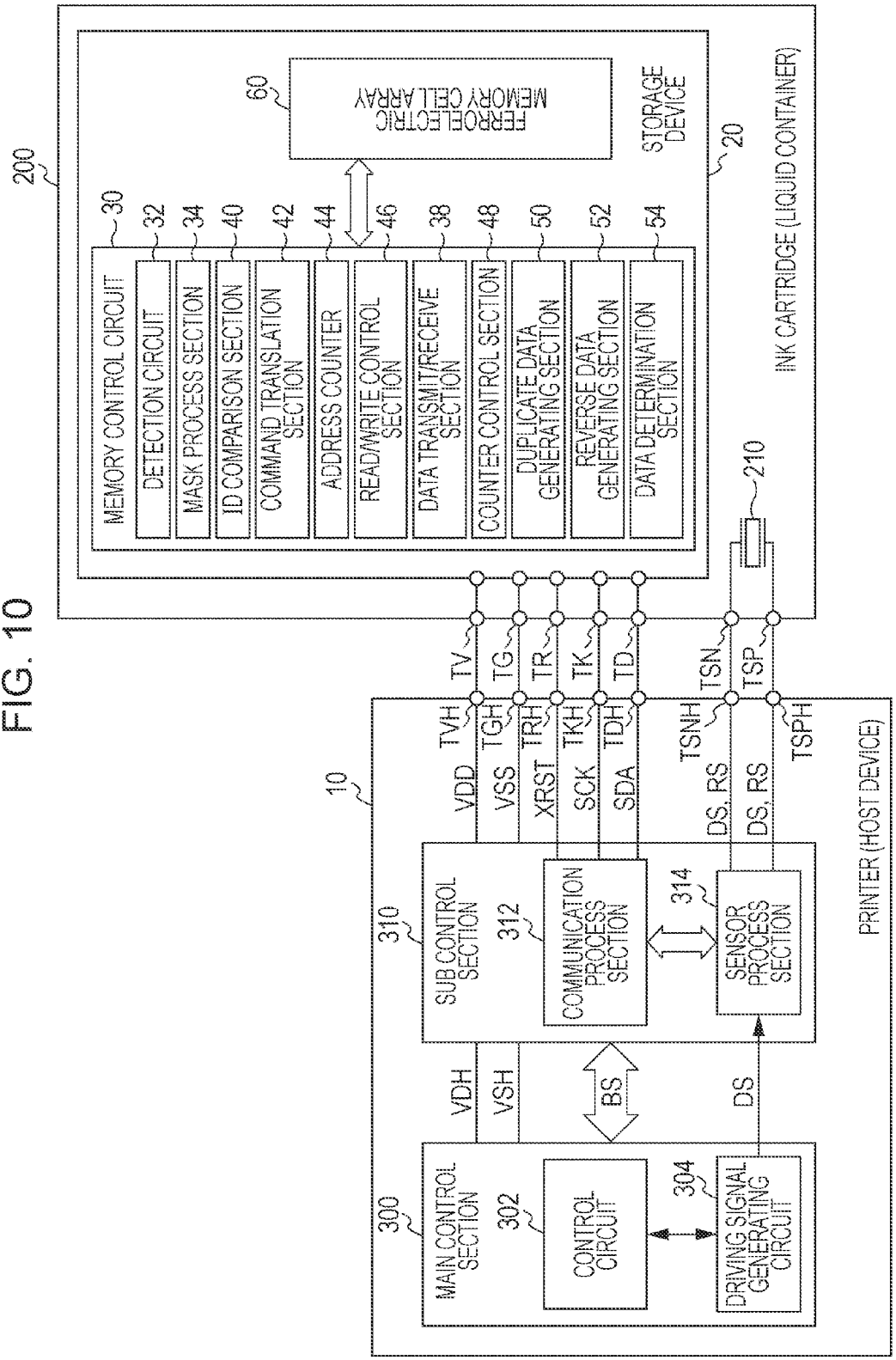
FIG. 10 is an explanatory view showing the detailed constitutions of the system.

FIG. 10 is an explanatory view showing the detailed constitutions of the system using the storage apparatus of this embodiment. The system (information processing system, and print system) shown in FIG. 10 includes the printer 10, and the ink cartridge 200. The printer 10 includes a main control section 300, and a sub control section 310. The ink cartridge 200 includes the storage apparatus 20, and the sensor 210 of this embodiment. Also, herein below, an embodiment will be described when one ink cartridge is mounted on the printer. However, a plurality of ink cartridge may be mounted on the printer in this embodiment.

The sub control section 310 supplies the power supply voltage VDD and ground voltage VSS to the storage apparatus 20 through the power supply terminal TVH and the ground terminal TGH, respectively. Also, the sub control section 310 performs a read/write of data to the storage apparatus 20, or the sensor process that uses the sensor 210. More specifically, the sub control section 310 includes a communication process section 312, and a sensor process section 314.

The communication process section 312 performs a communication process between the storage apparatus 20 and the main control section 300. More specifically, the reset signal XRST, system clock SCK, and data signal SDA are supplied to the storage apparatus 20 through the reset terminal THR, the clock terminal THK, and the data terminal THD, respectively. As describe herein below referred to in FIG. 11, serial communication process with the storage apparatus 20 is performed with those signals in this embodiment. However, parallel communication process between the communication process section 312 and the storage apparatus 20 may be performed as well. Also, the communication process section 312 exchanges command or data signals through a bus BS, to perform the communication process with the main control section 300. For example, the communication process section 312 determines connection or non-connection between the ink cartridge 200 and the printer 10, or the communication error to the storage apparatus 20, such that those determination results are transmitted to the main control section 300.

The sensor process section 314 performs the determination the residual amount of ink by the sensor 210. The sensor process section 314 applies the sensor driving signal DS from the main control section 300 to the electrode of the sensor 210 through the sensor driving terminal THSN or THSP. The sensor process section 314 determines whether or not the residual amount of ink is less than a threshold value or not more than the threshold value, on the basis of the signal obtained by applying the sensor driving signal DS to the sensor 210. The result of the determination is transmitted to the main control section 302 through the communication process section 312.

The main control section 300 controls the printer 10. For example, the main control section 300 controls the memory access, supplies power supply voltage VDH or ground voltage VSH to the sub control section 310, or determines the residual amount of ink (computing process). More specifically, the main control section 300 includes a control circuit 302 and a driving signal generating circuit 304.

The control circuit 302 transmits commands or data to the communication process section 312 through the bus BS and controls communication processing between the communication process section 312 and the storage apparatus 20. Specifically, when the connection of the ink cartridge 200 is detected by the communication process section 312, the control circuit 302 reads the data such as residual amount of ink stored in the storage apparatus 20, and writes such as residual amount of ink data newly computed on the basis of the data, to the storage apparatus 20. Also, the control circuit 302 controls the driving signal generating circuit 304 to supply the sensor driving signal DS to the sensor 210. Thus, the control circuit 302 determines the residual amount of ink, on the basis of the determination result regarding the residual amount of ink from the sensor process section 314, or estimated ink consumption amount by printing. When the determination is out of ink, a display section (not shown) may display information regarding out of ink.

The storage apparatus 20 includes a memory control circuit 30 (control section), and a ferroelectric memory cell array 60 (ferroelectric memory). The memory control circuit 30 includes a detection circuit 32, a mask control circuit 34, an ID comparison section 40, a command translation section 42, an address counter 44, a read/write control section 46, a data transmitting/receiving section 38 (transmitting/receiving section), a counter control section 48, a duplication data generating section 50, a reverse data generating section 52, and a data determination section 54 (determination section). Also, the constituent elements (for example, the detection circuit) similar to those of FIG. 1, described above, are given similar reference numbers thereof, thus not specifically described in here.

The ID comparison section 40 compares ID data (identification data) received from the sub control section 310 with the ID number (for example, number corresponding ink colors) assigned at the storage apparatus 20, to determine whether itself is the object of access or not.

The command translation section 42 translates SOF (communication start data) received from the sub control section 310, the command data, and the EOF (communication finish data), to determine the access start, kind of access such as read or write, and access finish. The address counter 44 counts the system clock SCK, to output the count value for assign address (for example, word line) of the ferroelectric memory cell array 60. The read/write control section 46 performs the read/write control to the ferroelectric memory cell array 60, on the basis of the count value of the address counter 44, or the kind of access translated by the command translation section 42. The counter control section 48 (sequencer) counts the system clock SCK, to the control memory access based on the count value and command translation by the command translation section 42.

The duplicate data generating section 50 copies original data read from ferroelectric memory cell array 60, to generate mirror data (the duplication data). The reverse data generating section 52 reverses each bit value (for example, reverse 0 to 1, or 1 to 0) of the original data read from the ferroelectric memory cell array 60, to generate reverse data. The data determination section 54 performs a parity check on the original data and the mirror data, or counts exclusive OR of the original data and the reverse data, to determine conformation of the data.

The ferroelectric memory cell array 60 includes a plurality of ferroelectric memory cell arranged along word line and a bit line. The ferroelectric memory cell array 60 may include a raw address decoder, a column address decoder and sense amp, which are not shown in the drawings.

7. Communication Process

Read Control

As described above, when the floating state of the power supply terminal or the ground terminal is detected, the storage apparatus of this embodiment stops the access control toward the ferroelectric memory. At this time, the printer need to identify the communication process with the storage apparatus, because the printer cannot identify directly that a floating state is detected.

Figure 11:
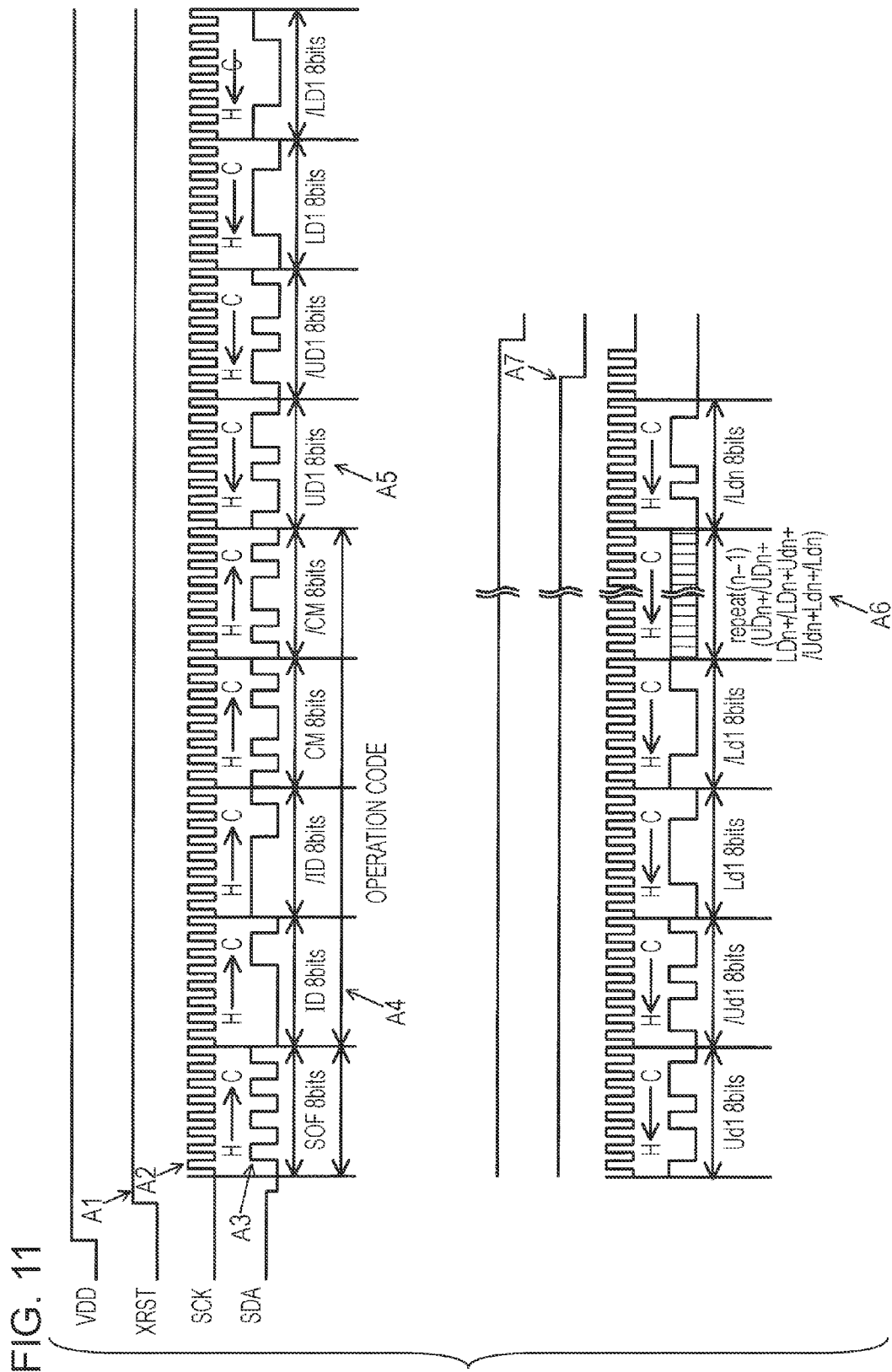
FIG. 11 is an explanatory view showing the signal waveform example in case of reading the data from the storage apparatus.

Herein below, detailed description will be made about communication process between the printer 10 and the storage apparatus 20 using FIG. 11 to FIG. 16. FIG. 11 is an explanatory view showing schematically the signal waveform example in case of reading the data from the storage apparatus 20. Also, a direction of data transmitting/receiving is in the arrow direction in FIG. 11. In other words, the arrow direction from H to C indicates that the sub control section 310 is transmission side and the storage apparatus 20 is on the receiving side. The arrow direction from C to H indicates the storage apparatus 20 is transmission side and sub control section 310 is on the receiving side.

As shown in A1 in FIG. 11, when the communication process starts the reset signal is set from low level to high level. As shown in A2, the system clock SCK is supplied to the storage apparatus 20. Also, as shown in A3, SOF (Start Of Frame) data as data signal SDA is initially transmitted to the storage apparatus 20. As shown in A4, ID data and the read command data as operation codes are transmitted to the storage apparatus 20. The original ID data ID as ID data and reverse ID data/ID (herein below, reverse data is indicated by a slash mark/) as the reverse of each bit value of the original ID data are transmitted to the storage apparatus 20. As the command data, the original command data CM and the reverse command/CM is transmitted.

As shown in A5, the read data is transmitted to the sub control section 310 from the storage apparatus 20. As the read data, high rank 8 bit UD1 of 16 bit original data, the reverse data/UD1, low rank 8 bit LD1 of the original data, and the reverse data/LD1 are transmitted. Also, the mirror data Ud1 of UD1, the reverse mirror data/Ud1, the mirror data Ld1 of LD1, and the reverse mirror data/Ld1 are transmitted. UD1, LD1, Ud1, and Ld1 are data that are read by the storage apparatus 20. Meanwhile, those reverse data /UD1, /LD1, /Ud1, and /Ld1 are data that are generated by the reverse data generating section 52. As shown in A6, reading and transmitting of read data (unit read data) as described above, are repeated. As shown in A8, when the transmission of read data is finished, the reset signal is set to low level.

As described above, when data is multiplexed by the original data and the reverse data, the operation error of the storage apparatus 20 is suppressed. For example, destruction of the nonvolatile memory data is prevented, which occurs due to receiving erroneous commands due to the communication fault, and erroneous writing or reading to the nonvolatile memory.

As described above referred to FIG. 1, the system clock SCK is masked, and read/write control or data transmitting/receiving is not performed, when the floating state of the power supply terminal or the ground terminal is detected. Then, for example, low level is outputted, as read data transmitted to the printer 10. Thus, the printer 10 may detect a floating state of the power supply terminal or the ground terminal as error of the communication process.

Figure 12:
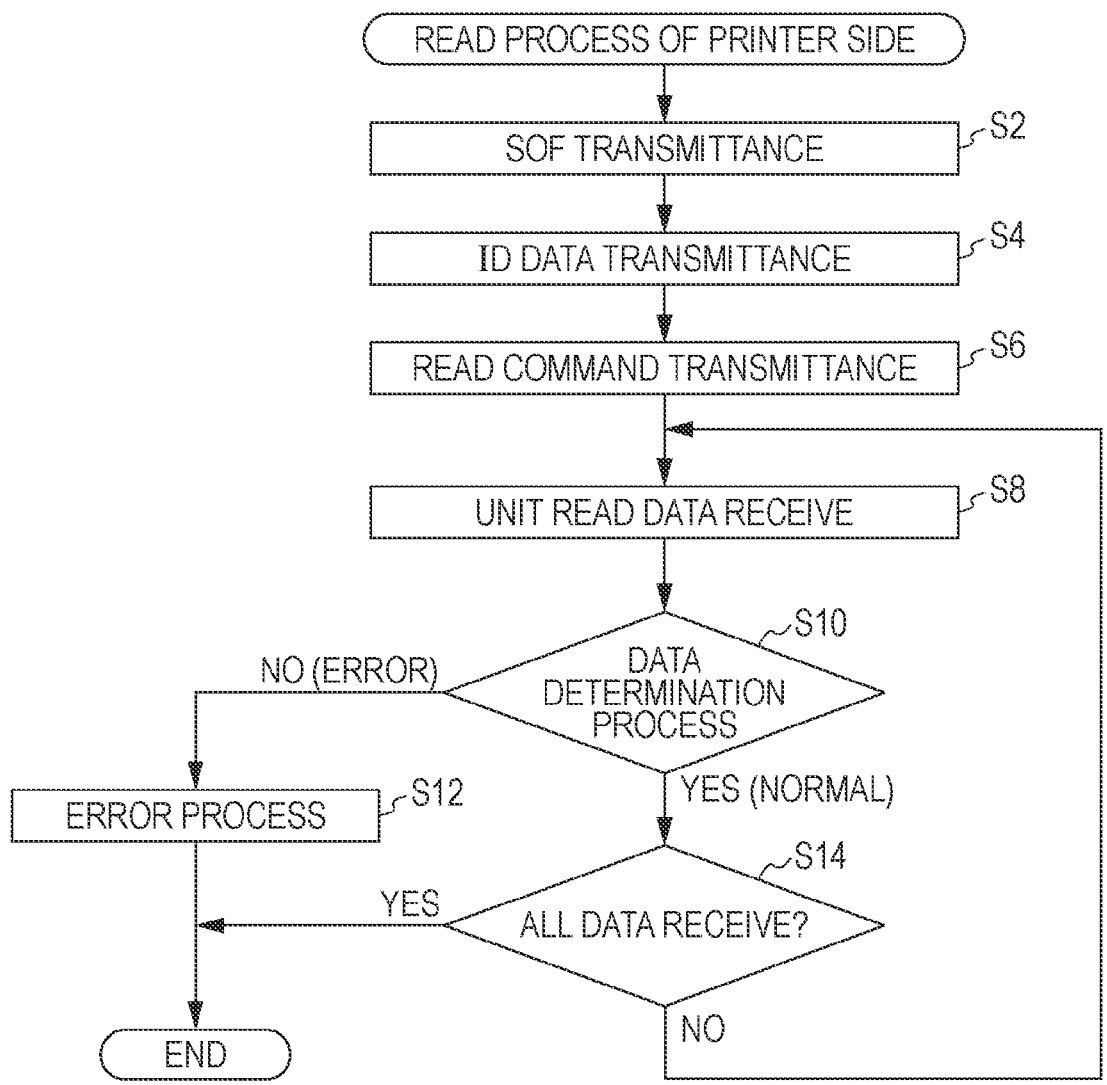
FIG. 12 is a flowchart showing the read process of the printer.

FIG. 12 is a flowchart showing the read process of the printer. As shown in FIG. 12, when the read process starts, the printer 10 transmits SOF data (S2), transmits ID data (S4), transmits read a command (S6), and receives unit read data (S8). When the printer receives unit read data, the data determination process of unit read data is performed (S10). Error processing is performed (S12), and the communication process is finished, when the results of the data determination is "error" (N). It is verified that all read data is received (S14), when the result of data determination is normal (Y). Communication process is finished, when all read data is received (Y), and unit read data is received (S8), when the read data is not received (N).

Also, in the data determination process (S10), for example, exclusive OR of the original data and the reverse data, exclusive OR of the mirror data and the reverse mirror data, or exclusive OR of the original data and the reverse mirror data are calculated. Each bit of those exclusive logic OR becomes 1, when the read or data transmitting/receiving occurs normally. In the data determination process, it determines the communication error or the memory cell error, on the basis of the operation result. And, in the error processing (S12), indication is displayed on the display section of the printer 10, that the ink cartridge 200 is not mounted properly on the printer 10 in case of communication error, for example.

Figure 13:
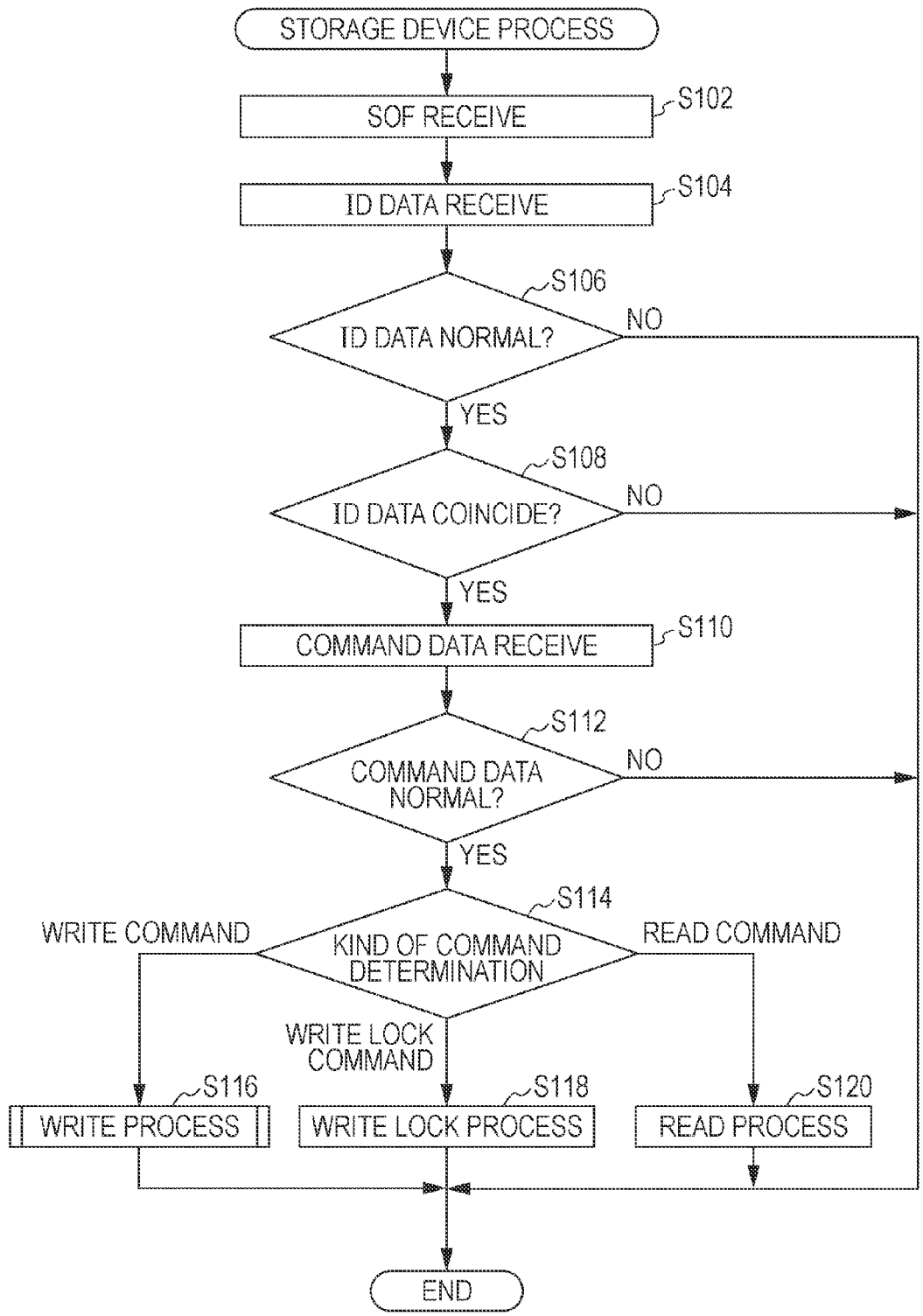
FIG. 13 is a flowchart showing the read process of the storage apparatus.

FIG. 13 is a flowchart showing the read process of the storage apparatus. As shown in FIG. 13, when the communication process is started, the storage apparatus 20 receives SOF data (S102), receives ID data (S104), and determines whether the received ID data is normal or not (S106). When ID data is not normal (N), the communication process is finished, and when ID data is normal (Y), determines whether ID data is coincide or not (S108). When ID data and ID number of the storage apparatus 20 do not match (N), the communication process is finished, and when those are coincide (Y), receives command data (S110). And, it determines whether or not the received command data is normal (S112). When the command data is not normal (N), the communication process is finished, and when the data is normal (Y), determines kind of command (S114). When the command is read command, the read process is performed (S120), and communication process is finished. Read and transmission of original data, or generation and transmission of reverse data is performed, in the read process.

Also, the storage apparatus 20 performs write process (S116) as described herein below refer to in FIG. 16, when the command is write command. Also, the write lock process performs (S118), when the command is write lock command. The write lock process is performed to set a region as incapable of writing in a section (or all section) of the rewritable region of the ferroelectric memory 60. Specifically, the address data is received followed by the write lock command. Thus, a region assigned by the received address data is set as the write lock region. For example, the write lock region is set as line unit of the ferroelectric memory 60 by setting write flag in the control register.

8. Communication Process

Write Control

Figure 14:
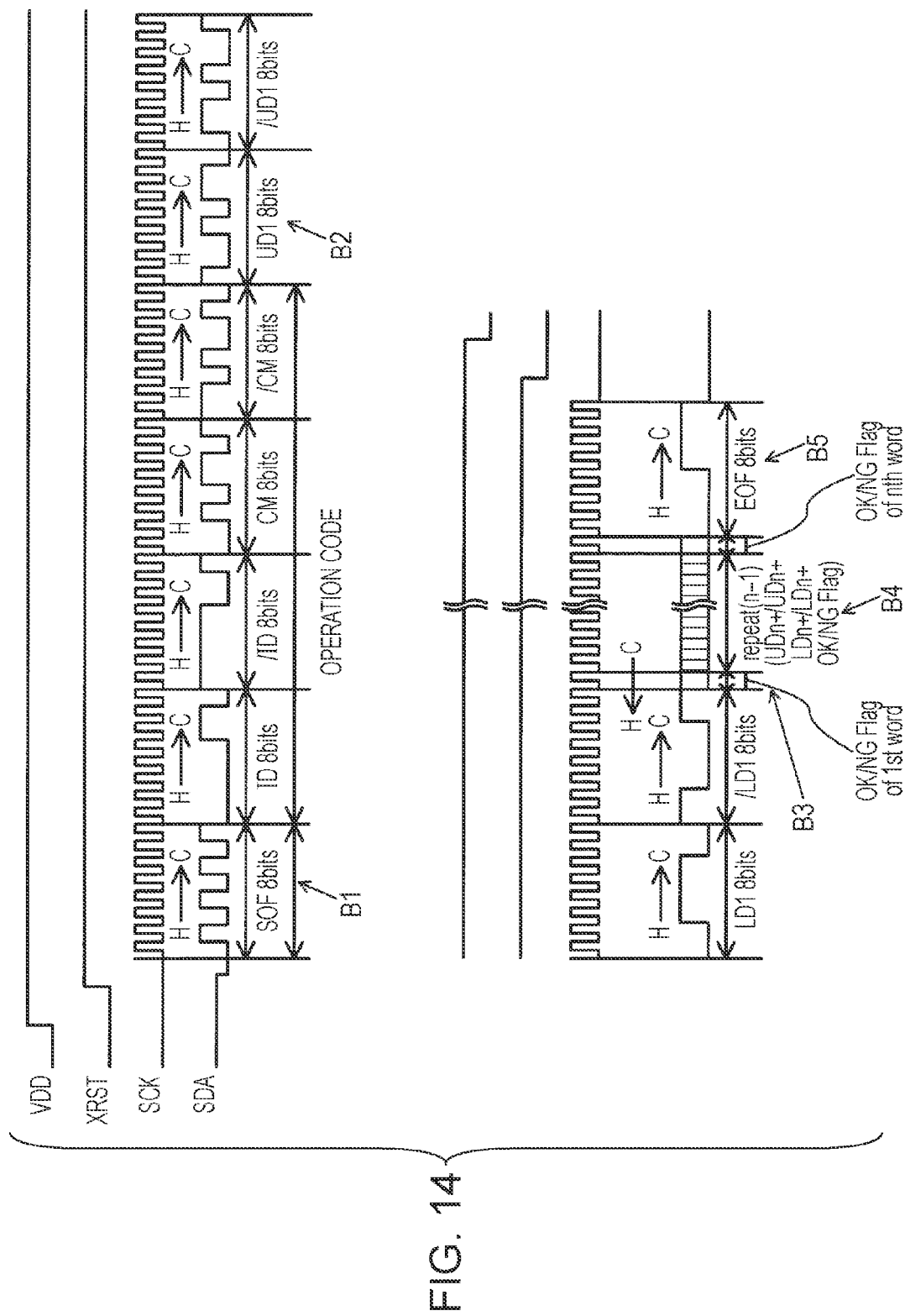
FIG. 14 is a view showing the signal waveform example in case of writing a data to the storage apparatus.

FIG. 14 is a view showing the signal waveform example in case of writing a data to the storage apparatus 20. As shown in B1 in FIG. 14, SOF data, ID data ID, reverse ID data/ID, write command data CM, and reverse write command data/CM are transmitted to the storage apparatus 20. Thus, as shown in B2, high rank 8 bit UD1 of 16 bit original data, the reverse data/UD1, low rank 8 bit LD1 of original data, and the reverse data/LD1 are transmitted as the write data. Also, the mirror data Ud1 of UD1, the reverse mirror data/Ud1, the mirror data Ld1 of LD1, and the reverse mirror data/Ld1 are transmitted to the storage apparatus 20.

As shown in B3, the storage apparatus 20 determines whether the transmitted data is normal or not, to transmit OK/NG flag to the printer 10, on the basis of the determination result. For example, high level OK flag is transmitted if the data is determined as normal, and low level NG flag is transmitted if data is abnormal. Thus, as shown in B4, transmission of the write data (unit write data), and transmission of OK/NG flag are repeated. As shown in B5, EOF (End Of Frame) data is transmitted to the storage apparatus 20, when transmission of the write data is finished.

Further, for example, the storage apparatus 20 outputs a low level as data signal SDA, if the floating state of the power supply terminal or the ground terminal is detected. Thus, the printer 10 receives low level (NG) as OK/NG flag, to determine the communication error. As described above, the printer 10 can detect a floating state of the power supply terminal or the ground terminal as error of the communication process.

Figure 15:
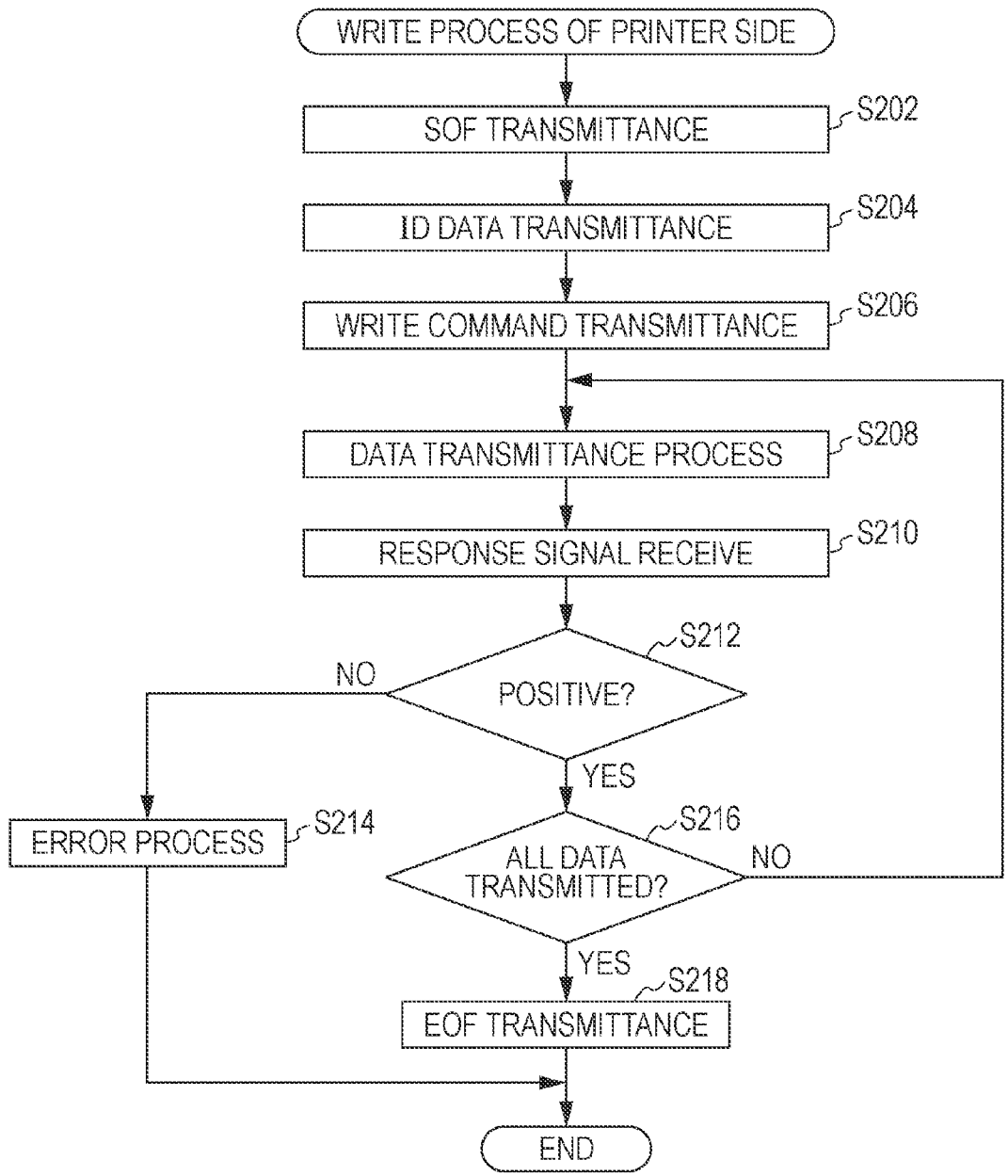
FIG. 15 is a flowchart showing the write process of the printer.

FIG. 15 is a flowchart showing the write process of the printer. As shown in FIG. 15, the printer 10 transmits SOF data (S202), transmits ID data (S204), and transmits write command data (S206), when the write process is started. Thus, transmission of unit write data is processed (S208), an OK/NG flag is received (S210), and it is determined whether the received OK/NG flag is an OK flag or NG flag (S212). The error processing is performed (S214), and the communication process is finished, if the OK/NG flag is an NG flag (N). A determination is performed whether all write data has been transmitted or not (S216), if the OK/NG flag is an OK flag (Y). EOF data is transmitted (S218), to finish the communication process, if all write data has been transmitted (Y). The transmission of unit write data is performed (S208), when all write data has been not transmitted (N).

Figure 16:
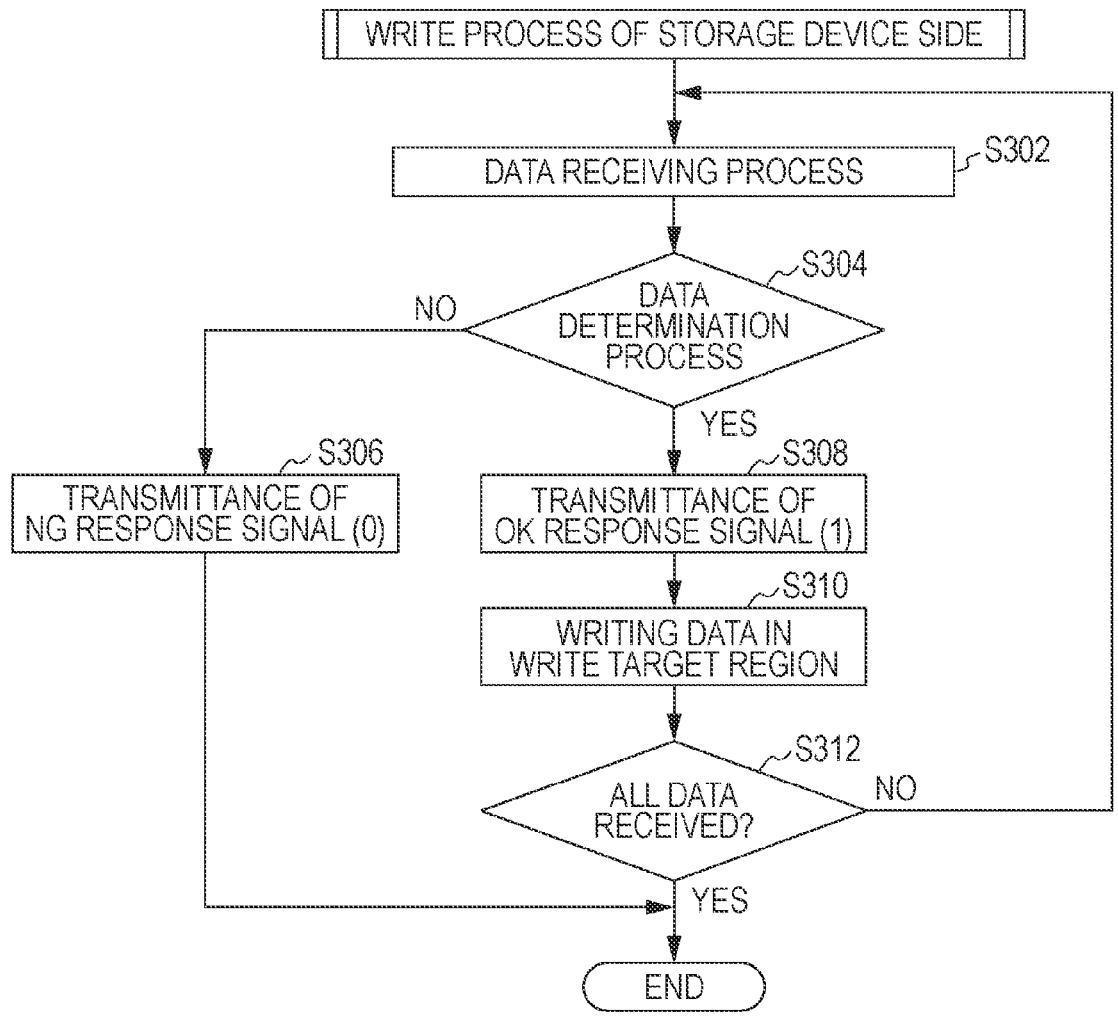
FIG. 16 is a flowchart showing the write process of the storage apparatus.

FIG. 16 is a flowchart showing the write process of the storage apparatus. The storage apparatus 20 performs write process, when receives write command data, as described above referred to in FIG. 13. As shown in FIG. 16, the write process performs unit write data receiving process (S302), and determines whether the received write data is normal or not (S304). When the write data is abnormal (N), NG flag is transmitted (S306), and the communication process is finished. When the write data is normal (Y), an OK flag is transmitted (S308), and the write data is recorded in the target region of the nonvolatile memory (S310). A determination is performed whether EOF data has been received or not (S312), then the communication process is finished, when it has been received (Y), and unit write data receiving process is performed (S302), when it is not received (N).

9. Floating Detection Circuit

Figure 17:
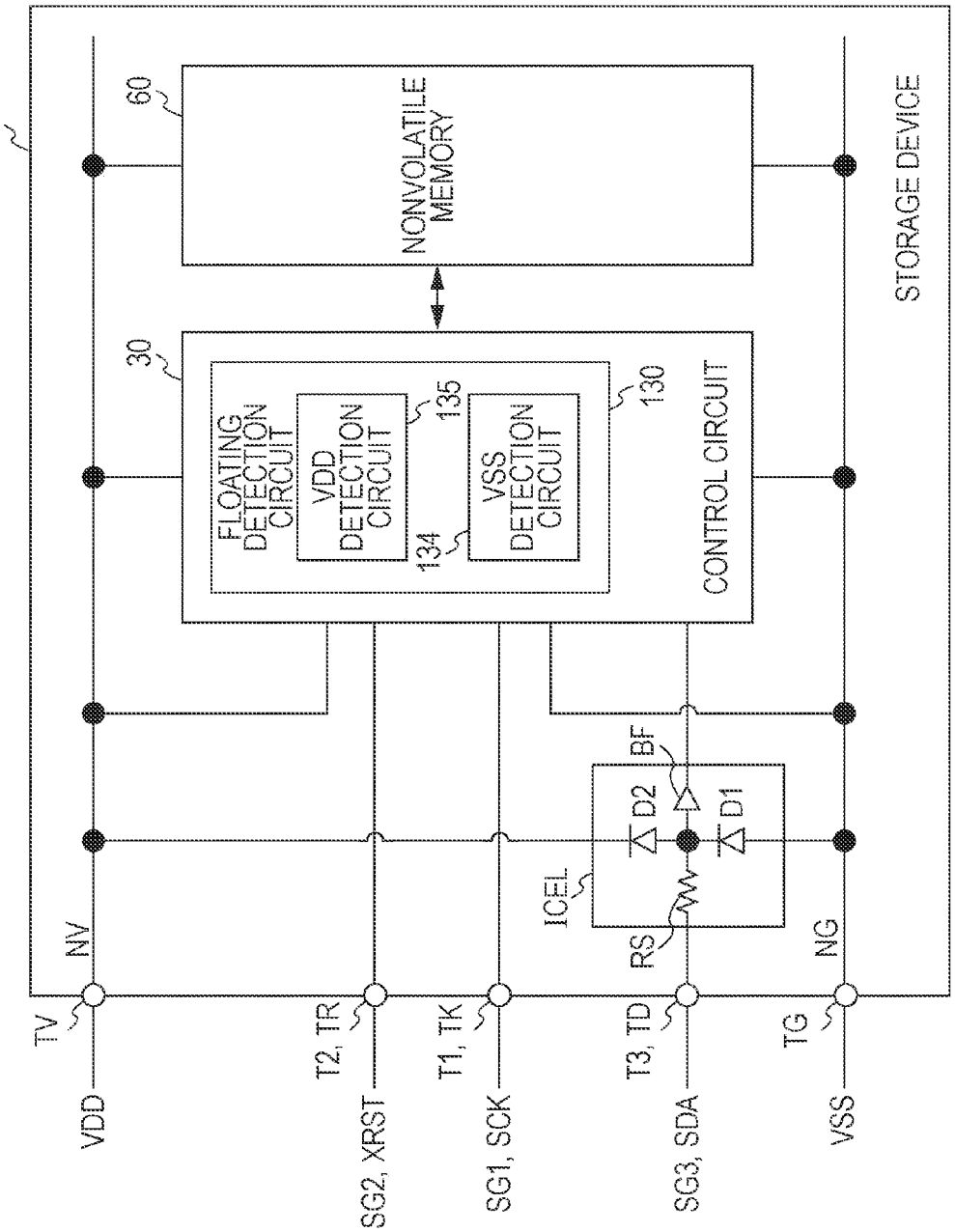
FIG. 17 is an explanatory view showing the detailed constitutions of a floating detection circuit.

FIG. 17 is an explanatory view showing the detailed constitutions of the floating detection circuit. The storage apparatus 20 in FIG. 17 includes input cell ICEL, control circuit 30, and nonvolatile memory 60. The control circuit 30 includes floating detection circuit 130.

The floating detection circuit 130 detects at least one of the floating state of the power supply line NV (power supply node) that is supplied the power supply voltage VDD from the power supply terminal TV, and floating state of the ground line NG (ground line, and ground node) that is supplied ground voltage VSS from the ground terminal TG. More specifically, the floating detection circuit 130 includes a VSS detection circuit 134 and a VDD detection circuit 135.

VSS detection circuit 134 compares voltage of the ground line NG with voltage (ground voltage) of first signal SG1 supplied from the first terminal T1, to detect a floating state of NG. For example, the terminal T1 is clock terminal TK and the signal SG1 is system clock SCK. Meanwhile, the VDD detection circuit 135 compares voltage of the power supply line NV with voltage (power supply voltage) of the second signal SG2 supplied from the second terminal T2, to detect a floating state of NV. For example, the terminal T2 is reset terminal TR, and the signal SG2 is a reset signal XRST (set signal).

The input cell ICEL buffers third signal SG3 supplied from the third terminal T3 (other terminal), to supply the third signal SG3 to the control circuit 30. For example, the terminal T3 is data terminal TD, and signal SG3 is a data signal SDA. The input cell ICEL includes a resistance element RS, a first diode D1 (first diode element), a second diode D2 (second diode element), and buffer FB. The resistance element RS, and the diode D1, D2 protect interior circuit from electrostatic damage. And, the input cell may be mounted on the terminal SG1, SG2 of this embodiment, even though it is not shown in FIG. 17.

Also, the ground terminal TG becomes floating state due to the inserting or the like of foreign materials. Then, low level (ground voltage) is supplied to the terminal T3. Also, voltage of the ground line NG is raised as much as the forward voltage of diode D1 from ground voltage VSS, because the current flows from the ground line NG to the terminal T3 through diode D1. The VSS detection circuit 134 detects the voltage increase.

Meanwhile, the power supply terminal TV becomes floating state due to the insertion or the like of foreign materials. Then, a high level (power supply voltage) is supplied to the terminal T3. Also, voltage of the power supply line NV drops as much as forward voltage of diode D2 from the power supply voltage VDD, because current flows from the terminal T3 to the power supply line NV through diode D2. VDD detection circuit 135 detects the voltage drop.

Detailed description will be made regarding VSS detection circuit using FIG. 18A to FIG. 18C. The VSS detection circuit 134 shown in FIG. 18A includes first to third N type transistors NT1 to NT3 (first conductive type transistor, in a broad sense), first and second P type transistors PT1, PT2 (second conductive type transistor, in a broad sense), and first and second inverters INV1, INV2.

The VSS detection circuit 134 includes a differential pair. More specifically, a transistor PT1 is mounted between a power supply line NV and first node N1. Signal SG1 input the gate electrode of PT1. A transistor PT2 is mounted between a power supply line NV and second node N2. The voltage of the ground line NG is input to the gate electrode of PT2. A transistor NT1 is mounted between node N1 and third node N3. A transistor NT2 is mounted between node N2 and node N3. Voltage of node N2 is input to gate electrode of the transistors NT1, NT2. A transistor NT3 is provided between node N3 and ground line NG. An enable signal EN (for example, reset signal XRST) is input to the gate electrode of NT3. During normal operation, EN is set high level. Voltage of node N1 as signal Q1 is input to the inverter INV1. Output signal of INV1 inputs the inverter INV2, and INV2 outputs output signal Q2.

Figure 18A:
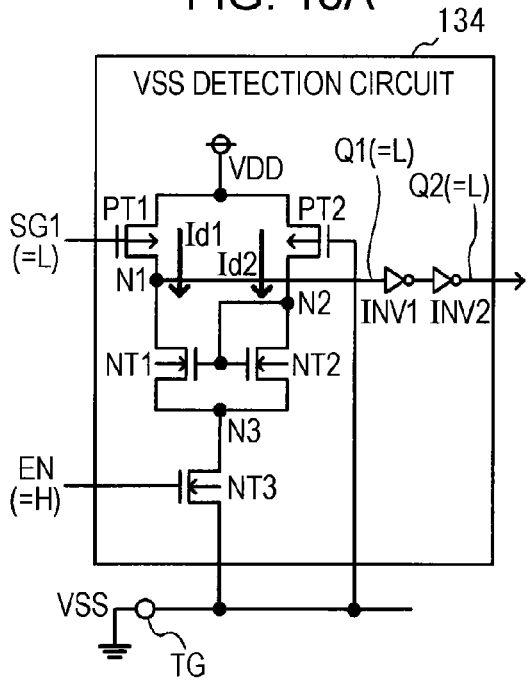
FIG. 18A is an explanatory view showing the detailed constitutions of a VSS detection circuit.

As shown in FIG. 18A, the drain current Id1 of PT1 is equal to the drain current Id2 of PT2, when the ground voltage VSS is supplied to the ground terminal TG. Then, the differential pair is designed, such that voltage of node N1 is less than logical threshold of the inverter INV1 (the inverter INV1 outputs high level), thus the output signal Q2 becomes high level.

Figure 18B:
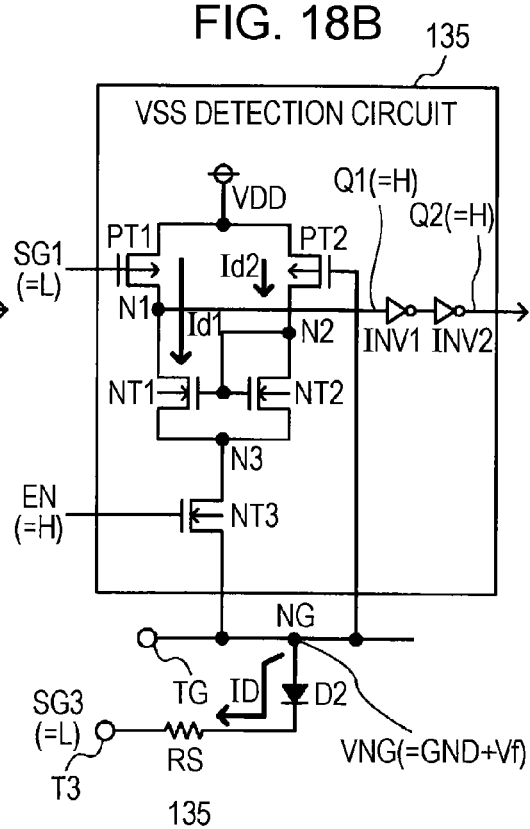
FIG. 18B and FIG. 18C are views explaining the operation of the VSS detection circuit.
Figure 18C:
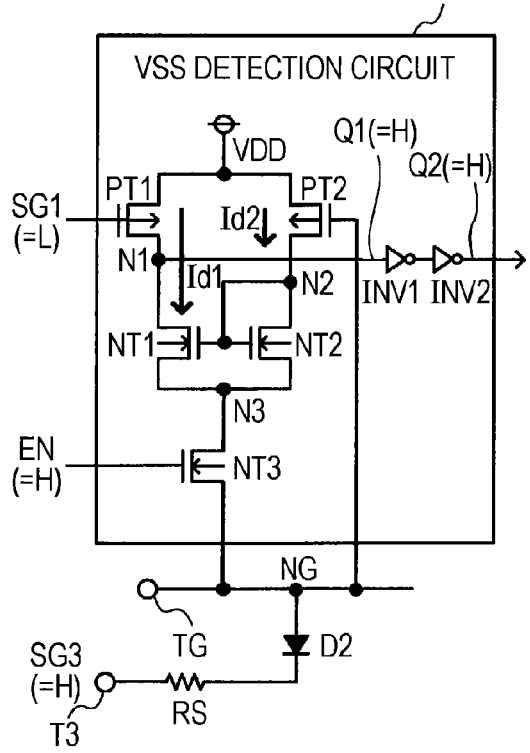

As shown in FIG. 18B, the ground terminal TG is floating state, and signal SG3 is set to low level. Then, Id1>Id2, and the voltage of node N1 rise, because the voltage of the ground line NG is raised as described above. Also, output signal Q2 of the inverter INV2 becomes high level. Meanwhile, as shown in FIG. 18C, signal SG3 is set to high level. Then, the voltage of NG is raised, because current path is lost from the ground line NG to VSS. Also, the output signal Q2 from the inverter INV2 becomes high level.

Also, VDD detection circuit 135 includes differential pair, as same that VSS detection circuit 134. For example, VDD detection circuit 135 includes first and second N type transistors NT1', NT2', and first to third P type transistors PT1' to PT3'. Thus, NT1' is mounted between the ground line NG and the first node N1', and the signal SG2 is input to the gate electrode. NT2' is provided between the ground line NG and the second node N2', and voltage of the power supply line NV is input to the gate electrode. PT1' and PT2' mount between nodes N1', N2' and third node N3', and voltage of node N2' is input to the gate electrode. PT3' is provided between node N3' and the power supply line NV, and the reverse signal of enable signal EN (it sets low level in normal operation) is input to the gate electrode.

10. Ferroelectric Memory

Detailed description will be made about the ferroelectric memory using FIG. 19 to FIG. 21C.

Figure 19:
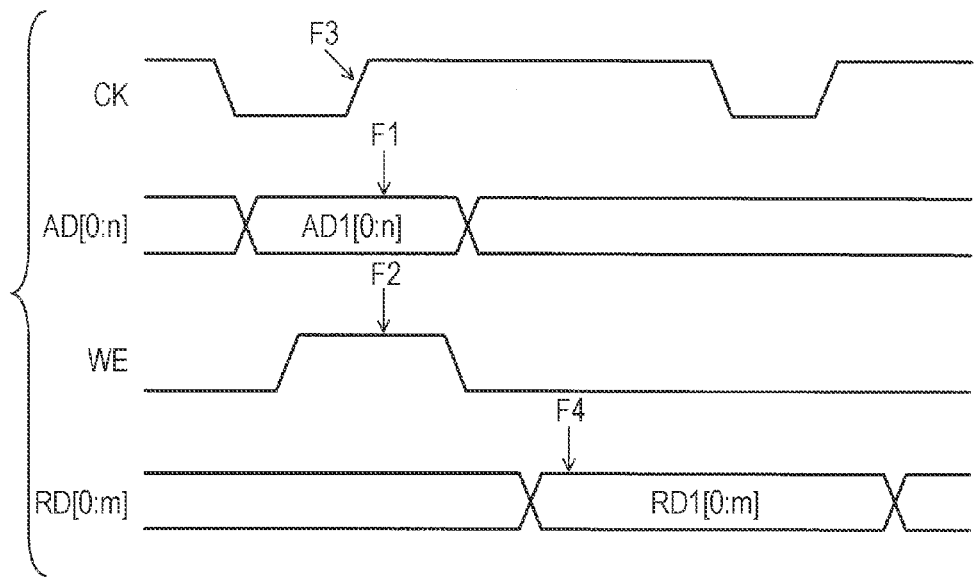
FIG. 19 is an explanatory view showing the signal waveform example of the read control to a ferroelectric memory.

FIG. 19 is an explanatory view showing the signal waveform example of the read control to the ferroelectric memory. As shown in F1 in FIG. 19, address signal AD [0:n] becomes address AD1 [0:n], as shown in F2, write enable signal WE is set to high level. Also, as shown in F3, when rising edge (or, down in edge) of clock CK for the memory access is inputted, data RD1 [0:m] of address AD1 [0:n] is reading by read data RD [0:m] as shown in F4. Also, clock CK is a clock that is generated by dividing the system clock SCK, for example.

Figure 20:
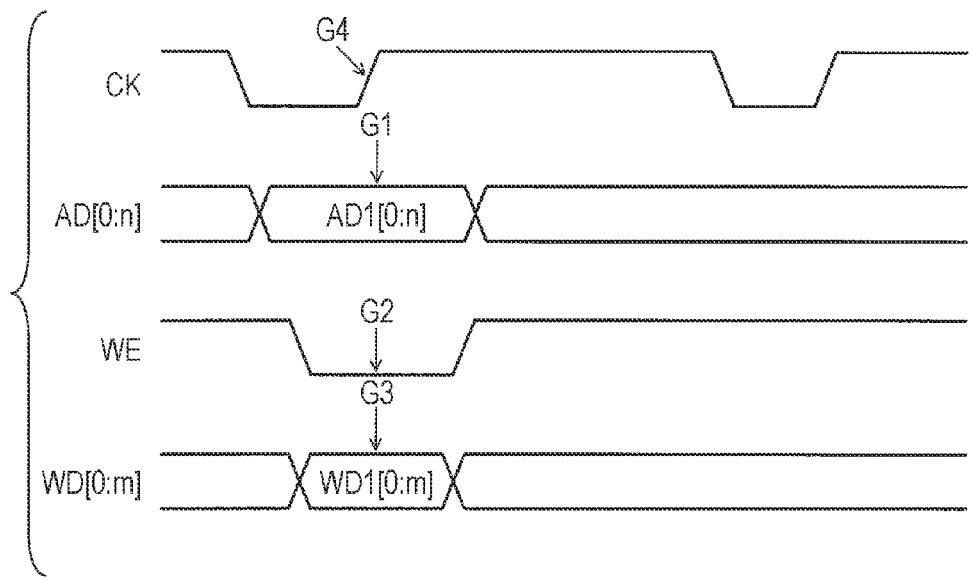
FIG. 20 is an explanatory view showing the signal waveform example of the write control to the ferroelectric memory.

FIG. 20 is an explanatory view showing signal waveform example of the write control to the ferroelectric memory. As shown in G1 in FIG. 20, address signal AD [0:n] becomes address AD1 [0:n], and as shown in G2, write enable signal WE is set to low level (active). As shown in G3, write data WD1 [0:m] is provided as data signal WD [0:m]. Also, as shown in G4, when rising edge of the clock CK is inputted, write data WD1 [0:m] recorded at address AD1 [0:n].

FIG. 21A is an explanatory view showing the constitutions of the ferroelectric memory cell. The ferroelectric memory cell includes ferroelectric capacitor CS, and N type transfer transistor TR (first conductive type transistor, in a broad sense).

Node NC is connected to an end of the ferroelectric capacitor CS, and plate line PL is connected to the other end thereof. Word line WL is connected to the gate electrode of the transistor TR, and bit line BL is connected to the source electrode (drain electrode), and node NC is connected to the drain electrode (source electrode). Also, the embodiment is not restricted to a 1T1C (1 Transistor 1 Capacitor) type as shown in FIG. 21A, but may be a 2T2C (2 Transistor 2 Capacitor) type, or FET type, or the like.

FIG. 21B is a view explaining write operation to the ferroelectric memory cell. As shown in FIG. 21B, selection voltage is applied to the word line WL, voltage of the power supply voltage VCC (for example, power supply voltage VDD. First power supply voltage, in a broad sense) is applied to bit line BL, and 0V (for example, ground voltage VSS. Second power supply voltage, in a broad sense) is applied to the plate line PL, when logic "1" is written to the memory cell. Thus, residual polarization of the ferroelectric capacitor CS becomes 'negative'. Accordingly, the state where residual polarization is 'negative' may be defined as the state in which logic "1" is stored, for example.

Meanwhile, the selection voltage is applied to the word line WL, 0V is applied to bit line BL, and VCC (for example, 5V) is applied to plate line PL when logic "0" is written to the memory cell. Thus, residual polarization of ferroelectric capacitor CS becomes 'positive'. Accordingly, the state where residual polarization is 'positive' may be defined as the state in which logic "0" is stored, for example.

FIG. 21C is an explanatory view explaining read operation to the ferroelectric memory cell. As shown in FIG. 21C, the selection voltage is applied to the word line WL, and transmission of charge from the ferroelectric capacitor CS to the bit line BL is performed, in the first period T1. Subsequently, voltage of bit line BL is amplified by the sense amp, in the second period T2. Also, the read data (logic "0" or "1") is maintained, rewrite operation is performed for recovering the data damaged by reading, in the third period T3.

Also, in this embodiment, the read operation may be performed in the order as described above, however the sense amp amplification and the rewrite operation may be performed in the same period, and the read operation may be performed in different order, such as maintenance of the read data may be performed in next period.

While this embodiment has been described in detail above, it will be understood by those skilled in the art that a number of modifications can be made to those embodiments without substantially departing from new matters and advantages of this invention. Therefore, it is to be noted that these modifications are all included in the scope of the invention. For example, terms referred as broader or equivalent terms (nonvolatile storage section, floating state, substrate, liquid container, host device, and the like) in the specification and drawings can be replaced with the broader or equivalent terms (nonvolatile memory, open state, circuit substrate, ink cartridge, printer, and the like) in any part of the specification and drawings. Also, the configurations and the operations of the control section, nonvolatile storage section, storage apparatus, substrate, liquid container, host device, and the like are not limited to what have been described in the embodiments, and various modifications can be made thereto.

What is claimed is:

1. A storage apparatus comprising:
a plurality of terminals including a reset terminal, a clock terminal, a power supply terminal and a ground terminal, the reset terminal being configured to be connected to a host side reset terminal to which a reset signal is supplied from a host device, the clock terminal being configured to be connected to a host side clock terminal to which a system clock is supplied from the host device, the power supply terminal being configured to be connected to a host side power supply terminal to which a power supply voltage is supplied from the host device, the ground terminal being configured to be connected to a host side ground terminal to which ground voltage is supplied from the host device;
a nonvolatile storage section, and
a control section that controls the nonvolatile storage section,
wherein the control section comprises:
a detection circuit that detects a floating state in at least one of the power supply terminal and the ground terminal, the detection circuit being configured to output a detection signal indicating whether the floating state is detected or not; and
a mask process circuit that performs a mask process of a system clock that is used to control the nonvolatile storage section,
wherein the mask process circuit inputs the detection signal, and masks the system clock when the floating state is detected by the detection circuit.

2. The storage apparatus according to claim 1, wherein the mask process section has a holding section which maintains a logic level of the detection signal.

3. The storage apparatus according to claim 2, wherein the holding section clears the holding state of the logic level of the detection signal when a reset signal which resets the control section becomes active.

4. The storage apparatus according to claim 1, wherein the control section has an access control section that performs access control of reading or writing to the nonvolatile storage section, and
the mask process section masks the system clock which is supplied to the access control section when the floating state is detected by the detection circuit.

5. The storage apparatus according to claim 4, wherein the control section has a transmission section that performs data transmission to the host device,
the mask process section does not mask the system clock which is supplied to the transmission section and the access control section such that the access control section reads data from the nonvolatile storage section and the transmission section transmits the data to the host device, when the floating state is not detected by the detection circuit, and
the mask process section masks the system clock, such that the data is not transmitted to the host device, and the detection of the floating state is detected as a communication error by the host device, when the floating state is detected by the detection circuit.

6. The storage apparatus according to claim 1, wherein the control section has a data determination section determining that data received from the host device is normal or not, and
the mask process section masks the system clock which is supplied to the data determination section, when the floating state is detected by the detection circuit.

7. The storage apparatus according to claim 6, wherein the control section has a transmission section that performs data transmission to the host device,
the mask process section does not mask the system clock such that the data determination section determines whether data received from the host device is normal or not, and the transmission section transmits information on the determination results to the host device by the data determination section, when the floating state is not detected by the detection circuit, and
the mask process section masks the system lock such that the information on the determination result is not transmitted to the host device, and the detection of the floating state is detected as a communication error by the host device, when the floating state is detected by the detection circuit.

8. The storage apparatus according to claim 1, wherein the nonvolatile storage section is a nonvolatile memory that is necessary for rewriting of the read data in the reading operation.

9. A system comprising:
a storage apparatus according to claim 1; and
a host device.

10. A liquid container comprising:
an ink chamber configured to contain ink;
a plurality of terminals including a clock terminal, a reset terminal and a power supply terminal, the clock terminal being configured to be connected to a host side clock terminal to which a system clock is supplied from a host device, the reset terminal being configured to be connected to a host side reset terminal to which a reset signal is supplied from the host device, the power supply terminal being configured to be connected to a host side power supply terminal to which a power supply voltage is supplied from the host device;
a nonvolatile storage section configured to be controlled by the system clock;
a control section that controls the nonvolatile storage section, the control section including a detection circuit that detects a floating state in the power supply terminal, the detection circuit being configured to compare a voltage of the reset signal with the power supply voltage and to output a detection signal indicating whether the floating state is detected or not; and
a mask process circuit that performs a mask process of the system clock, the mask process circuit being configured to input the detection signal and mask the system clock when the floating state is detected by the detection circuit.

11. A liquid container according to claim 10, the detection circuit being configured to compare a voltage of the reset signal with the power supply voltage and to output a detection signal indicating whether the floating state is detected or not.

12. A liquid container according to claim 11, the detection circuit having a differential pair that is configured to compare the voltage of the reset signal with the power supply voltage, the reset signal being input to a first terminal of the differential pair, the power supply voltage being input to a second terminal of the differential pair.

13. A liquid container comprising:
an ink chamber configured to contain ink;
a plurality of terminals including a clock terminal and a ground terminal, the clock terminal being configured to be connected to a host side clock terminal to which a system clock is supplied from a host device, the ground terminal being configured to be connected to a host side ground terminal to which ground voltage is supplied from the host device;
a nonvolatile storage section configured to be controlled by the system clock;
a control section that controls the nonvolatile storage section, the control section including a detection circuit that detects a floating state in the ground terminal, the detection circuit being configured to compare a voltage of the system clock with the ground voltage and to output a detection signal indicating whether the floating state is detected or not; and
a mask process circuit that performs a mask process of the system clock, the mask process circuit being configured to input the detection signal and mask the system clock when the floating state is detected by the detection circuit.

14. A liquid container according to claim 13, the detection circuit being configured to compare a voltage of the system clock with the ground voltage and to output a detection signal indicating whether the floating state is detected or not.

15. A liquid container according to claim 14, the detection circuit having a differential pair that is configured to compare a voltage of the system clock with the ground voltage, the system clock being input to a first terminal of the differential pair, the ground voltage being input to a second terminal of the differential pair.

* * * * *